United States Patent
Hong et al.

(10) Patent No.: US 9,331,287 B2
(45) Date of Patent: May 3, 2016

(54) ORGANIC LIGHT EMITTING DIODE

(71) Applicant: LG CHEM, LTD., Seoul (KR)

(72) Inventors: Sung Kil Hong, Daejeon (KR); Minseung Chun, Daejeon (KR); Kongkyeom Kim, Daejeon (KR); Jungi Jang, Daejeon (KR); Yun Hwan Kim, Seoul (KR); Dong Hoon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/342,947

(22) PCT Filed: Feb. 27, 2013

(86) PCT No.: PCT/KR2013/001577
§ 371 (c)(1),
(2) Date: Mar. 5, 2014

(87) PCT Pub. No.: WO2013/129836
PCT Pub. Date: Sep. 6, 2013

(65) Prior Publication Data
US 2014/0217392 A1    Aug. 7, 2014

(30) Foreign Application Priority Data
Feb. 27, 2012 (KR) .................. 10-2012-0019965

(51) Int. Cl.
*H01L 51/50*    (2006.01)
*H01L 51/54*    (2006.01)
(Continued)

(52) U.S. Cl.
CPC .......... *H01L 51/006* (2013.01); *H01L 51/0052* (2013.01); *H01L 51/0054* (2013.01);
(Continued)

(58) Field of Classification Search
CPC ............ H01L 51/0052; H01L 51/0054; H01L 51/0058; H01L 51/006; H01L 51/0061; H01L 51/0067; H01L 51/0068; H01L 51/0072; H01L 51/0073; H01L 51/0074; H01L 51/0096; H01L 51/50; H01L 51/5096; H05B 33/20; C09K 11/06
See application file for complete search history.

(56) References Cited

U.S. PATENT DOCUMENTS

| | | | |
|---|---|---|---|
| 8,486,543 B2 * | 7/2013 | Seo ..................... | H01L 51/0052 313/504 |
| 2003/0049489 A1 * | 3/2003 | Hatwar et al. ................ | 428/690 |

(Continued)

FOREIGN PATENT DOCUMENTS

| | | |
|---|---|---|
| EP | 2031670 A1 | 3/2009 |
| EP | 2085382 A1 | 8/2009 |

(Continued)

OTHER PUBLICATIONS

English translation of JP 2007-110093 dated Apr. 26, 2007.†

*Primary Examiner* — Dawn Garrett
(74) *Attorney, Agent, or Firm* — Dentons US LLP

(57) ABSTRACT

The present invention relates to an organic light emitting diode and a method of manufacturing the same. An organic light emitting diode according to the present invention comprises an exciton blocking layer comprising a compound represented by Formula 1 to confine an exciton to a light emitting layer to prevent light emitting leakage, and thus there is an effect of implementing an organic electroluminescence diode having excellent light emitting efficiency. Accordingly, it is possible to implement an organic light emitting diode having a simple and economical manufacturing process, a low voltage, high efficiency, and a long life span as compared to the related art.

6 Claims, 1 Drawing Sheet

(51) Int. Cl.
*H01L 51/00* (2006.01)
*H05B 33/20* (2006.01)
*C09K 11/06* (2006.01)

(52) U.S. Cl.
CPC ........ *H01L51/0058* (2013.01); *H01L 51/0061* (2013.01); *H01L 51/0067* (2013.01); *H01L 51/0068* (2013.01); *H01L 51/0072* (2013.01); *H01L 51/0073* (2013.01); *H01L 51/0074* (2013.01); *H01L 51/50* (2013.01); *H05B 33/20* (2013.01); *C09K 11/06* (2013.01); *H01L 51/5056* (2013.01); *H01L 51/5096* (2013.01)

(56) References Cited

U.S. PATENT DOCUMENTS

| | | | |
|---|---|---|---|
| 2005/0225235 A1† | 10/2005 | Kim | |
| 2008/0014464 A1† | 1/2008 | Kawamura | |
| 2008/0124572 A1† | 5/2008 | Mizuki | |
| 2008/0315753 A1* | 12/2008 | Liao et al. | 313/504 |
| 2009/0079338 A1* | 3/2009 | Mori et al. | 313/504 |
| 2009/0160323 A1† | 6/2009 | Nomura | |
| 2010/0044689 A1 | 2/2010 | Nishimura et al. | |
| 2010/0219400 A1* | 9/2010 | Arakane et al. | 257/40 |
| 2010/0301312 A1† | 12/2010 | Jinde | |
| 2011/0193476 A1* | 8/2011 | Higo et al. | 313/504 |
| 2011/0315965 A1* | 12/2011 | Takashima et al. | 257/40 |
| 2012/0091438 A1 | 4/2012 | Yabunouchi et al. | |
| 2012/0146014 A1* | 6/2012 | Kato | 257/40 |
| 2012/0292606 A1 | 11/2012 | Kato | |
| 2013/0032788 A1* | 2/2013 | Lee et al. | 257/40 |

FOREIGN PATENT DOCUMENTS

| | | |
|---|---|---|
| EP | 2224510 A1 | 9/2010 |
| EP | 2468725 A1 | 6/2012 |
| EP | 2757094 A1 | 7/2014 |
| JP | 2007-110093 A | 4/2007 |
| JP | 2007110093 A † | 4/2007 |
| JP | 2007-520470 A | 7/2007 |
| JP | 2009076817 | 4/2009 |
| JP | 2009-298767 A | 12/2009 |
| JP | 2010097964 | 4/2010 |
| WO | 2005-090512 A1 | 9/2005 |
| WO | 2007-148660 A1 | 12/2007 |
| WO | 2008123178 A1 | 10/2008 |
| WO | 2009/072587 A1 | 6/2009 |
| WO | 2009081857 A1 | 7/2009 |
| WO | 2010114021 A1 | 10/2010 |
| WO | 2011021520 A1 | 2/2011 |
| WO | WO 2011/021520 A1 * | 2/2011 |
| WO | 2011/040607 A1 | 4/2011 |

\* cited by examiner
† cited by third party

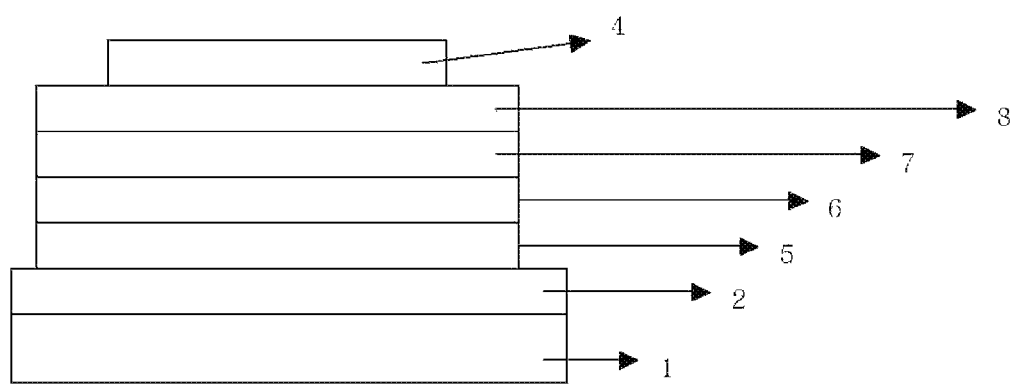

ORGANIC LIGHT EMITTING DIODE

This application is a 35 USC §371 National Stage entry of International Application No. PCT/KR2013/001577, filed on Feb. 27, 2013, which claims priority of Korean Application No. 10-2012-0019965, filed on Feb. 27, 2012, all of which are hereby incorporated by reference in their entirety.

TECHNICAL FIELD

The present invention relates to an organic light emitting diode. More particularly, the present invention relates to an organic light emitting diode having excellent characteristics comprising a low voltage, high efficiency, and a long life span, and a simple manufacturing process.

BACKGROUND ART

An organic light emitting phenomenon is an example of a conversion of current into visible rays by an internal process of a specific organic molecule. The organic light emitting phenomenon is based on the following principle. When an organic material layer is interposed between an anode and a cathode, if voltage is applied between two electrodes, electrons and holes are injected from the cathode and the anode to the organic material layer. The electrons and the holes injected into the organic material layer are recombined to form an exciton, and the exciton is reduced to a bottom state to emit light. An organic light emitting diode using the principle may be generally constituted by a cathode, an anode, and an organic material layer interposed therebetween, for example, an organic material layer comprising a hole injection layer, a hole transport layer, a light emitting layer, and an electron transport layer.

The material used in the organic light emitting diode is mostly a pure organic material or a complex compound where an organic material and metal form a complex, and may be classified into a hole injection material, a hole transport material, a light emitting material, an electron transport material, an electron injection material and the like according to the purpose. Herein, an organic material having a p-type property, that is, an organic material easily oxidized and electrochemically stable while the organic material is oxidized, is mainly used as the hole injection material or the hole transport material. Meanwhile, an organic material having an n-type property, that is, an organic material which is easily reduced and electrochemically stable while the organic material is reduced, is mainly used as the electron injection material or the electron transport material. A material having both p-type and n-type properties, that is, a material that is stable when the material is oxidized and reduced, is preferable as the light emitting layer material, and a material having high light emitting efficiency for converting the exciton into light when the exciton is formed is preferable.

In addition, it is preferable that the material used in the organic light emitting diode further have the following properties.

First, it is preferable that the material used in the organic light emitting diode have excellent thermal stability. This is because joule heat is generated by the movement of electric charges in the organic light emitting diode. Recently, NPB, which has mostly been used as the hole transport layer material, has a glass transition temperature of 100° C. or lower, and thus there is a problem in that it is difficult to use NPB in an organic light emitting diode requiring high current.

Second, holes or electrons injected into the organic light emitting diode should be smoothly transported to a light emitting layer, and the injected holes and electrons should not be released out of the light emitting layer in order to obtain an organic light emitting diode that is capable of being driven at a low voltage and has high efficiency. To this end, a material used in the organic light emitting diode should have an appropriate band gap and HOMO or LUMO energy level. In the case of PEDOT:PSS currently used as a hole transport material in an organic light emitting diode manufactured by a solution coating method, since a LUMO energy level thereof is lower than that of an organic material used as a light emitting layer material, it is difficult to manufacture an organic light emitting diode having high efficiency and a long life span.

In addition, the material used in the organic light emitting diode should have excellent chemical stability, electric charge mobility, and interfacial characteristic with an electrode or an adjacent layer. That is, the material used in the organic light emitting diode should be little deformed by moisture or oxygen. Further, appropriate hole or electron mobility should be ensured so as to balance densities of the holes and the electrons in the light emitting layer of the organic light emitting diode, thus maximizing formation of excitons. In addition, an interface with an electrode comprising metal or metal oxides should be favorable for stability of the diode.

In order to sufficiently exhibit excellent characteristics of the aforementioned organic light emitting diode, a material forming the organic material layer in the diode, for example, the hole injection material, the hole transport material, the light emitting material, the electron transport material, the electron injection material, and the like should be supported by stable and efficient materials in advance, but development of a stable and efficient organic material layer material for organic light emitting diodes has not yet been sufficiently made, such that there is still a demand for developing a new material.

DISCLOSURE

Technical Problem

The present invention has been made in an effort to provide an organic light emitting diode having excellent characteristics comprising a low voltage, high efficiency, and a long life span, and a simple manufacturing process.

Technical Solution

An exemplary embodiment of the present invention provides an organic light emitting diode comprising an anode, a cathode, and one or more organic material layers interposed between the anode and the cathode, in which the organic material layer comprises a light emitting layer, and the organic material layer comprising a compound represented by the following Formula 1 and the organic material layer comprising a compound represented by the following Formula 2 are comprised between the anode and the light emitting layer.

[Formula 1]

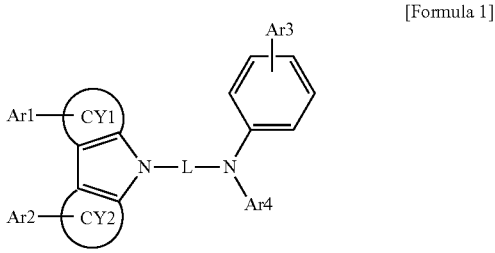

In Formula 1,

CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms,

[Formula 2]

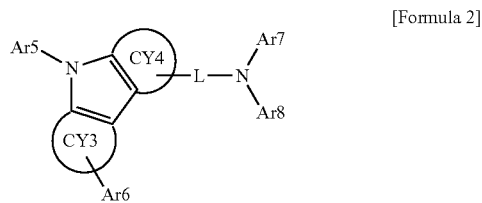

in Formula 2,

CY3 to CY4 are the same as or different from each other, and each independently represent a benzene cycle or a naphthalene cycle, Ar5 to Ar8 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, at least one of Ar7 and Ar8 is a substituted or unsubstituted fluorene group or a substituted or unsubstituted naphthyl group, and L is a substituted or unsubstituted arylene group having 6 to 30 carbon atoms.

Advantageous Effects

An organic light emitting diode according to the present invention comprises an exciton blocking layer comprising a compound represented by Formula 1 to confine an exciton to a light emitting layer to prevent light emitting leakage, and thus there is an effect of implementing an organic electroluminescence diode having excellent light emitting efficiency. Accordingly, it is possible to implement an organic light emitting diode having a simple and economical manufacturing process, a low voltage, high efficiency, and a long life span as compared to the related art.

BRIEF DESCRIPTION OF THE DRAWINGS

FIG. 1 illustrates an example of an organic light emitting diode formed of a substrate 1, an anode 2, a hole injection layer 5, a hole transport layer 6, a light emitting layer 7, an electron transport layer 8, and a cathode 4.

BEST MODE

Hereinafter, the present invention will be described in more detail.

In an organic light emitting diode, when a light emitting layer is formed, since a diffusion distance of a triple exciton is 100 nm or more, which is long, the triple exciton deviates from the light emitting layer having a thickness of 20 to 30 nm to largely reduce light emitting efficiency, and thus it is preferable to confine the triple exciton to the light emitting layer by using an appropriate exciton blocking layer.

An organic light emitting diode according to the present invention comprises an anode, a cathode, and one or more organic material layers interposed between the anode and the cathode, in which the organic material layer comprises a light emitting layer, and the organic material layer comprising a compound represented by Formula 1 and the organic material layer comprising a compound represented by Formula 2 are comprised between the anode and the light emitting layer.

In the organic light emitting diode according to the present invention, a hole transport layer may be comprised between the anode and the light emitting layer, and may comprise the compound represented by Formula 2.

In the organic light emitting diode according to the present invention, an electron blocking layer may be comprised between the anode and the light emitting layer, and may comprise the compound represented by Formula 1.

In this case, the electron blocking layer may be an organic material layer that is in contact with the light emitting layer.

In the organic light emitting diode according to the present invention, the electron blocking layer may act as the exciton blocking layer by comprising the compound represented by Formula 1.

In the organic light emitting diode according to the present invention, substituent groups of Formulas 1 and 2 will be described in more detail below.

In Formula 1, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms. That is, in the definitions of Ar4, a substituted or unsubstituted fluorene group, and a substituted or unsubstituted naphthalene group are excluded.

Examples of the halogen group may comprise fluorine, chlorine, bromine, iodine, and the like, but are not limited thereto.

An alkyl group may be a straight chain or a branched chain, and specific examples thereof comprise a methyl group, an ethyl group, a propyl group, an isopropyl group, a butyl group, a t-butyl group, a pentyl group, a hexyl group, a heptyl group, and the like, but are not limited thereto.

An alkenyl group may be a straight chain or a branched chain, and specific examples thereof comprise an alkenyl group connected to an aryl group such as a stylbenzyl group and a styrenyl group, but are not limited thereto.

Examples of an alkoxy group may comprise a methoxy group, an ethoxy group, an isopropyloxy group, and the like, but are not limited thereto.

An aryl group may be a monocycle type or a polycycle type. Examples of the monocyclic aryl group may comprise a phenyl group, a biphenyl group, a terphenyl group, stilben, and the like, and examples of the polycyclic aryl group may comprise a naphthyl group, an anthracenyl group, a phenanthrene group, a pyrenyl group, a perylenyl group, a cryxenyl group, a fluorene group, and the like, but are not limited thereto.

The heteroaryl group is a heteroatom and a cyclic group comprising O, N, S, or P, examples of a heterocyclic group comprise a carbazole group, a thiophene group, a furan group, a pyrrole group, an imidazole group, a thiazole group, an oxazole group, an oxadiazole group, a triazole group, a pyridyl group, a pyradazine group, a quinolynyl group, an isoquinolyn group, an acrydyl group, and the like, and the compounds of the following Structural Formulas are preferable but are not limited thereto.

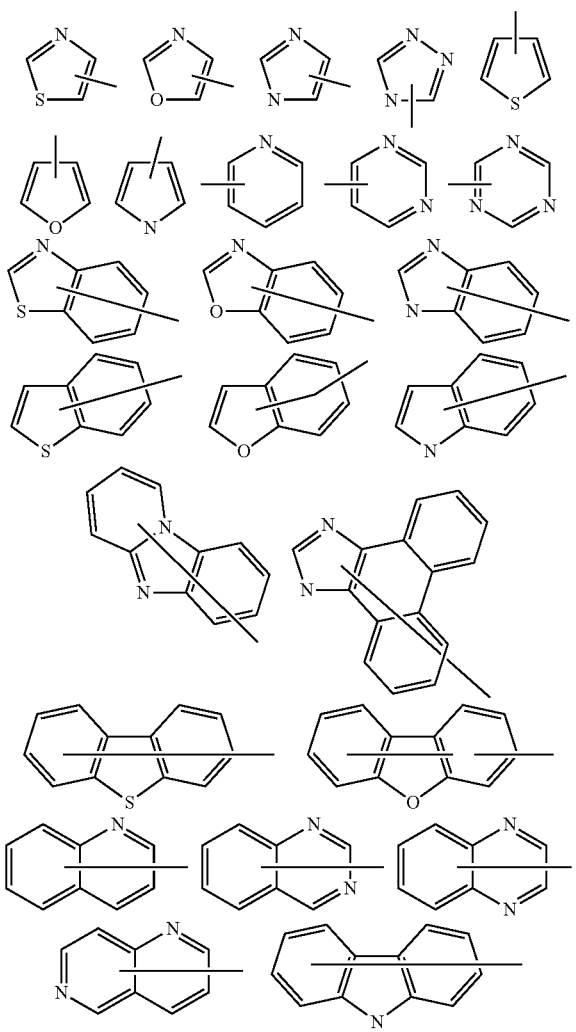

Further, in the present specification, the term "substituted or unsubstituted" means that substitution is performed by one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, and a fluorenyl group and a nitrile group substituted or unsubstituted by an aryl group, or there is no substituent group.

CY1 to CY4, L, and Ar1 to Ar8 of Formulas 1 and 2 may be further substituted by additional substituent groups, and specific examples thereof may comprise a halogen group, an alkyl group, an alkenyl group, an alkoxy group, a silyl group, an arylalkenyl group, an aryl group, a heteroaryl group, a carbazole group, an arylamine group, a fluorenyl group substituted or unsubstituted by an aryl group, a nitrile group, and the like, but are not limited thereto.

In Formula 1, in the case where both CY1 and CY2 are a benzene cycle, Ar3 is preferably hydrogen or a phenyl group and Ar4 is preferably a phenyl group or a biphenyl group, but Ar3 and Ar4 are not limited thereto.

In Formula 1, in the case where both CY1 and CY2 are a benzene cycle, L is preferably a biphenyl group, but is not limited thereto.

The compound represented by Formula 1 may be represented by any one of the following Formulas 3 to 5.

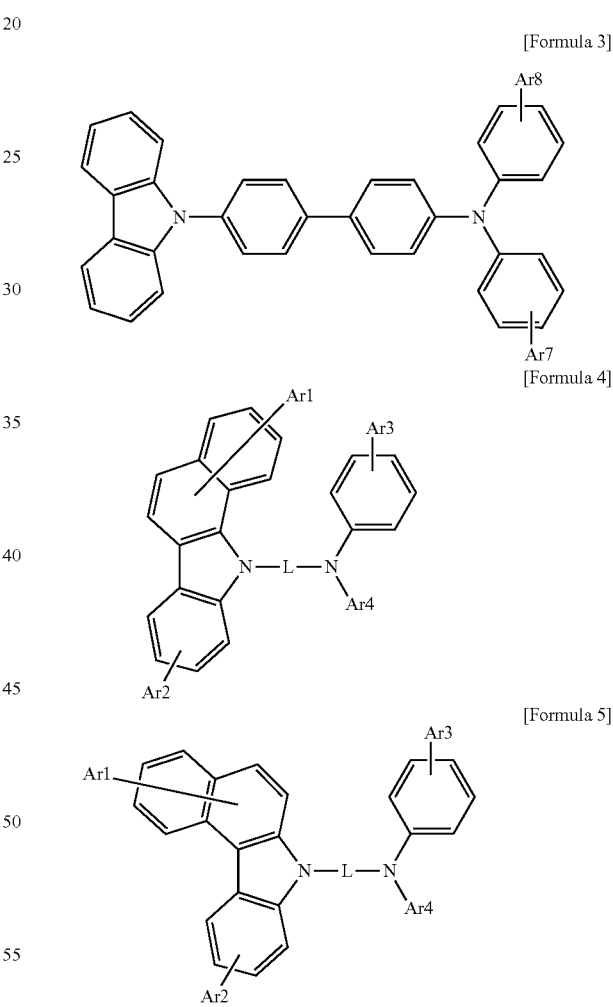

In Formulas 3 to 5,
Ar1 to Ar4, and L are the same as definitions of Formula 1, and
at least one of Ar7 and Ar8 is a phenyl group, and the other is hydrogen, a substituted or unsubstituted alkyl group having 1 to 10 carbon atoms, or a phenyl group.

The compound represented by Formula 1 may be preferably selected from the group consisting of the following Structural Formulas, but is not limited thereto.

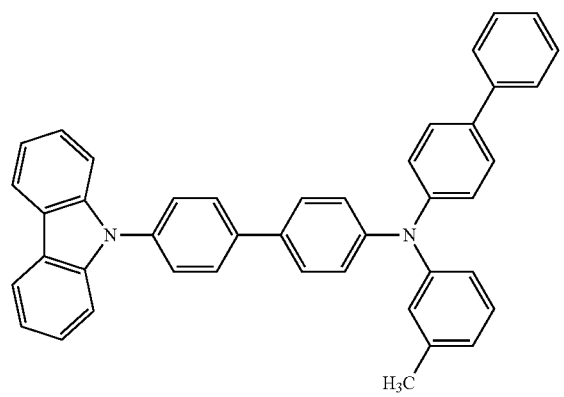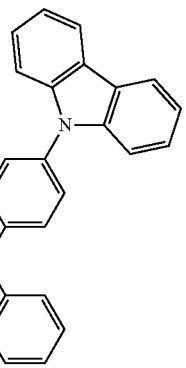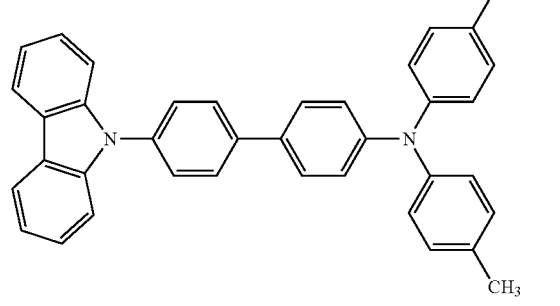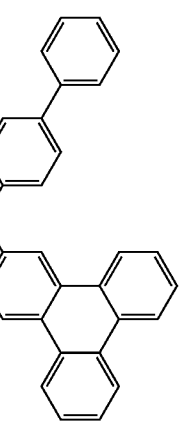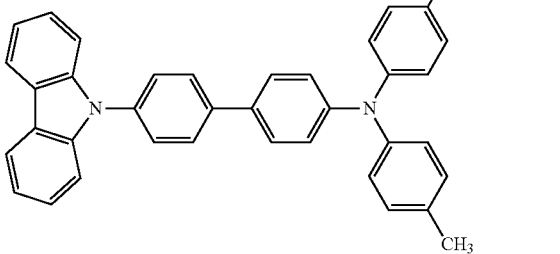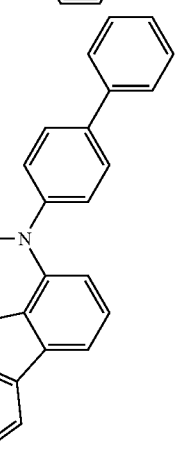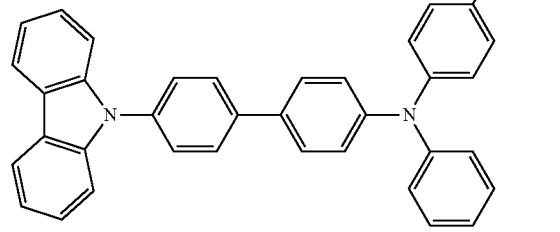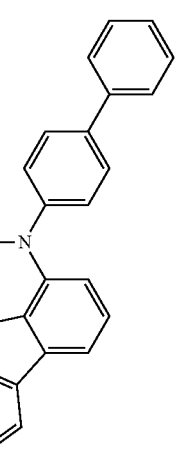

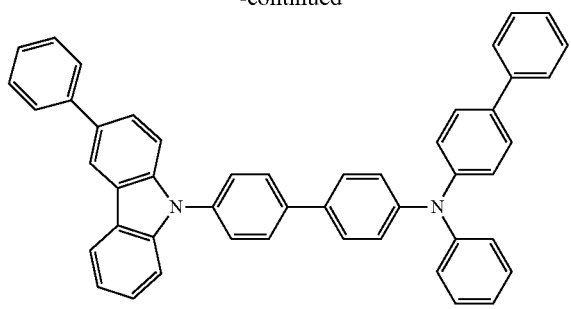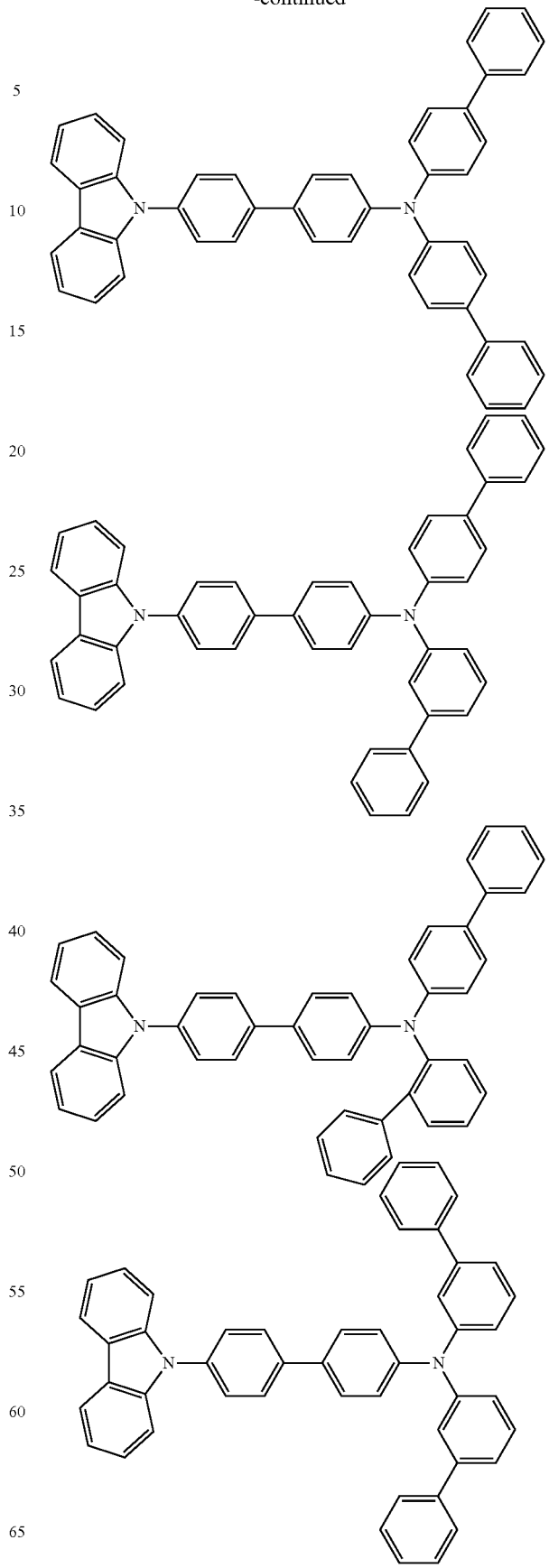

-continued
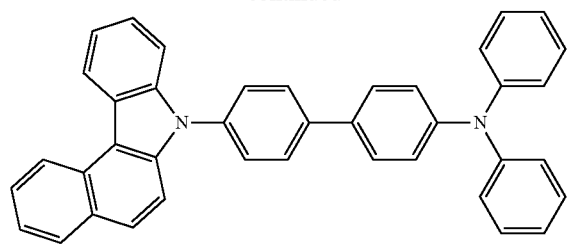
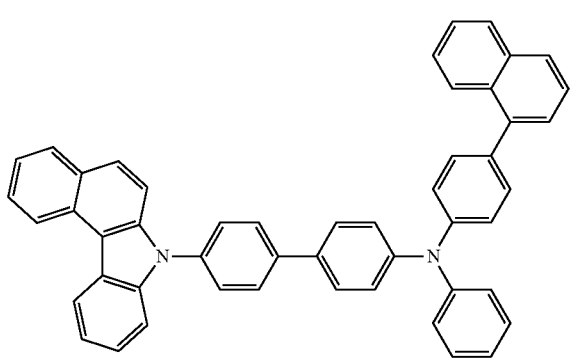
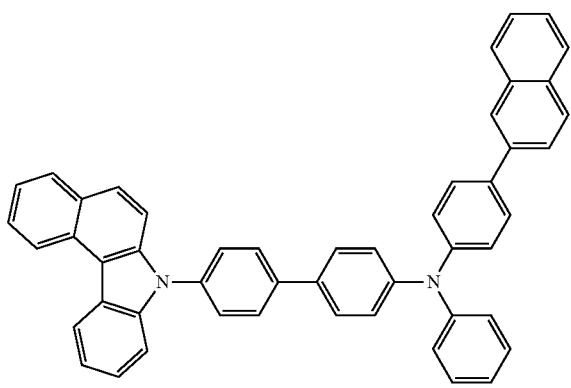
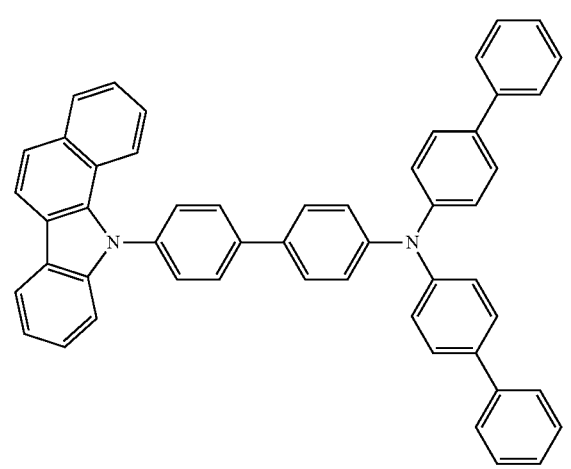
-continued
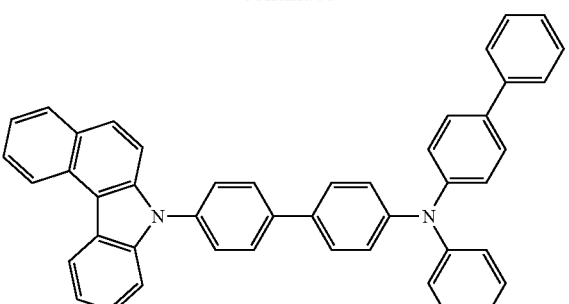
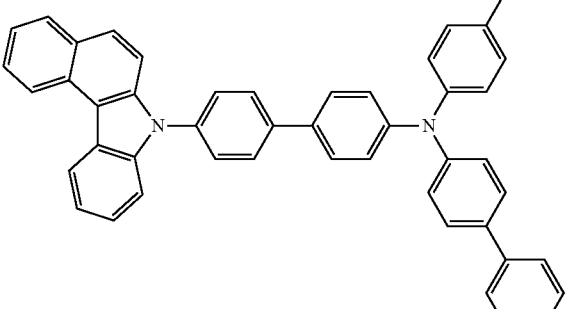
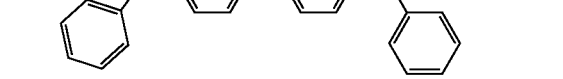
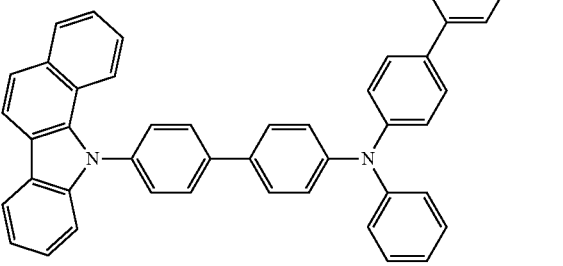

13
-continued
14
-continued
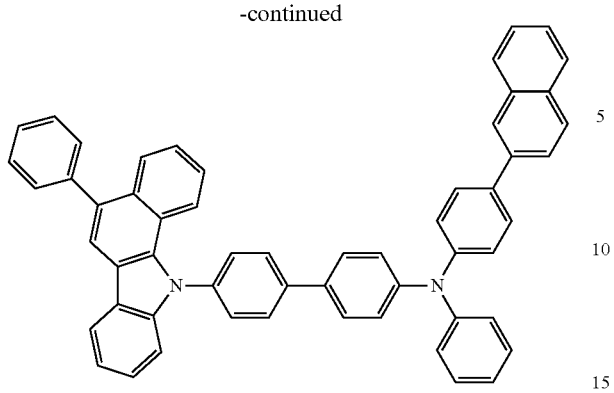
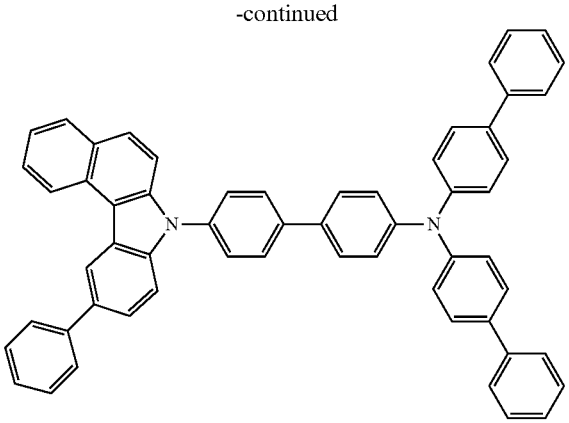
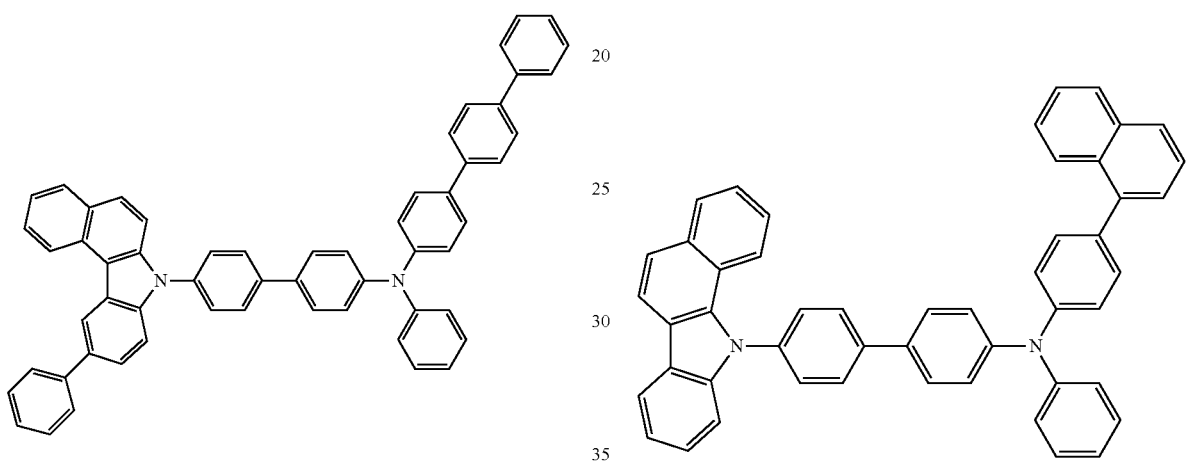
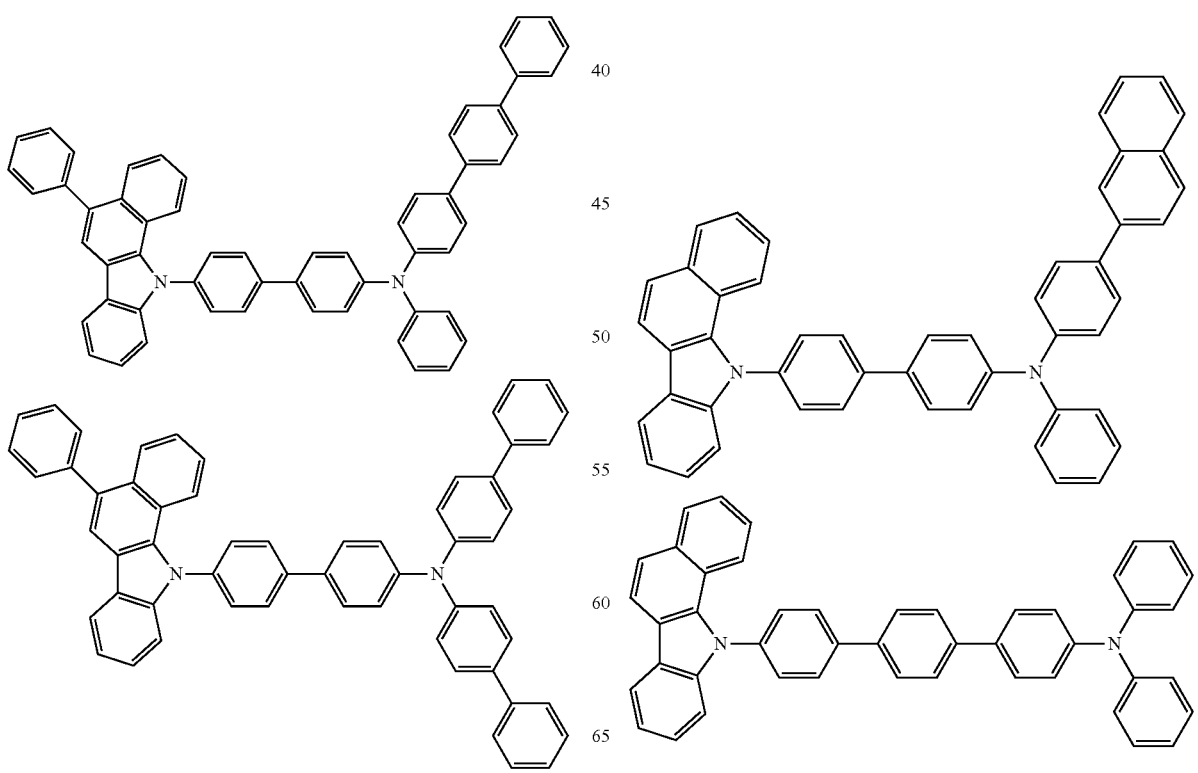

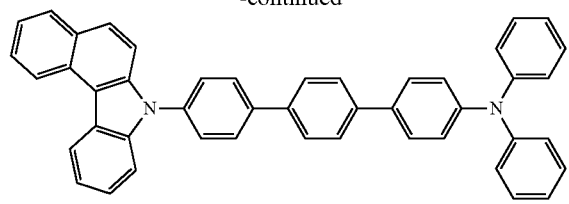
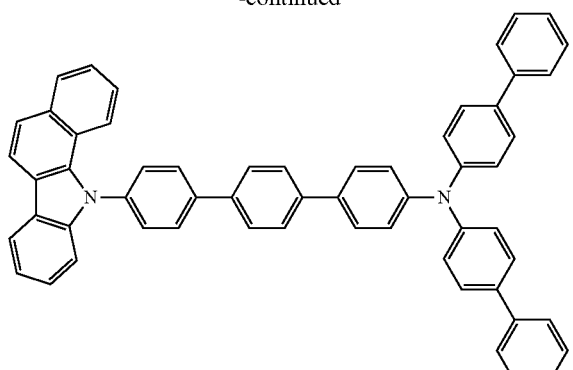
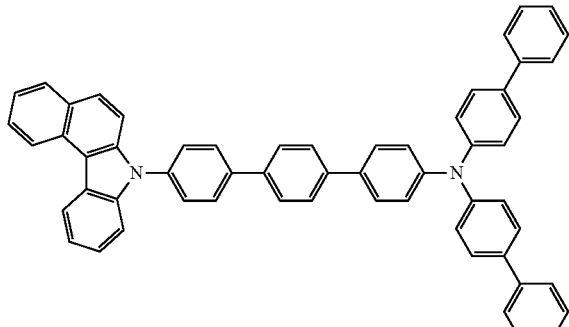
The compound represented by Formula 2 may be preferably selected from the group consisting of the following Structural Formulas, but is not limited thereto.
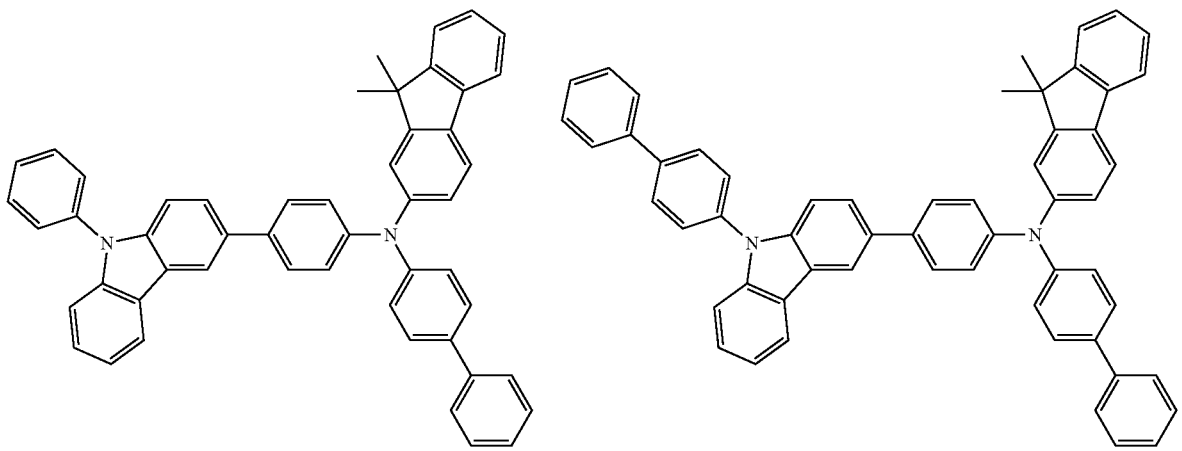

-continued
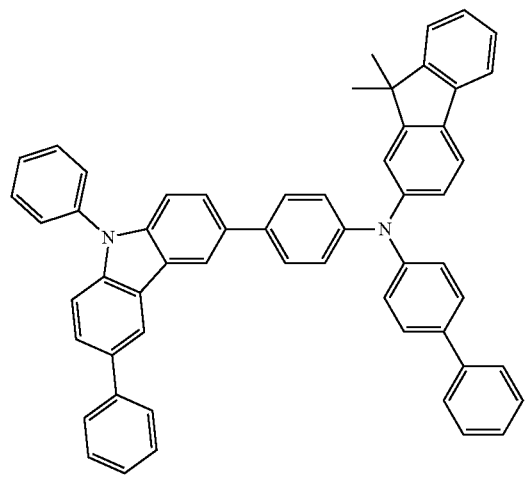
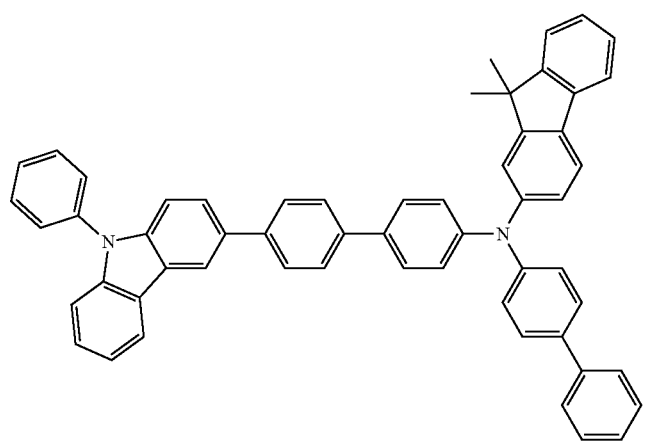
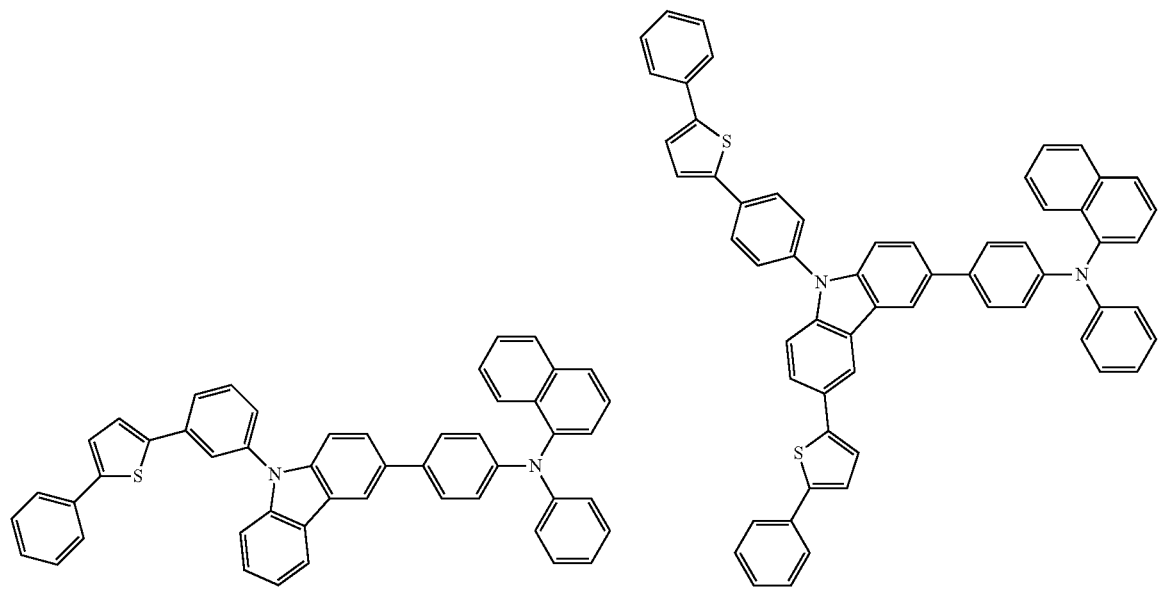
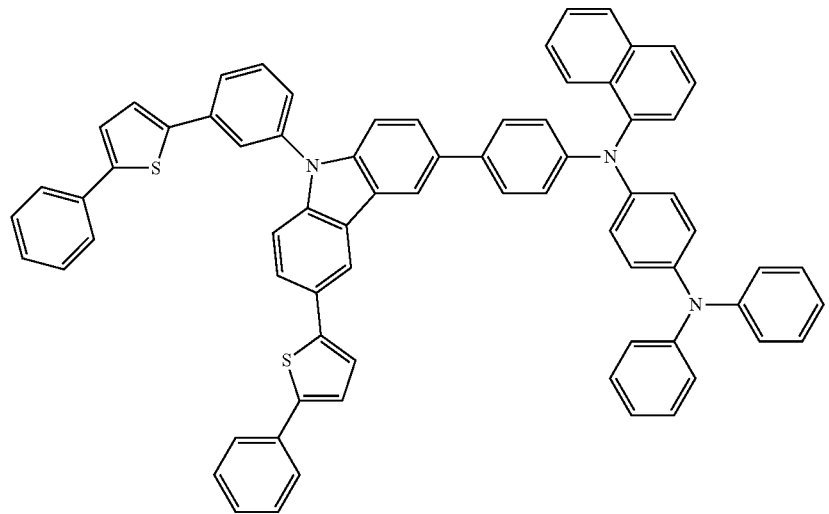

-continued
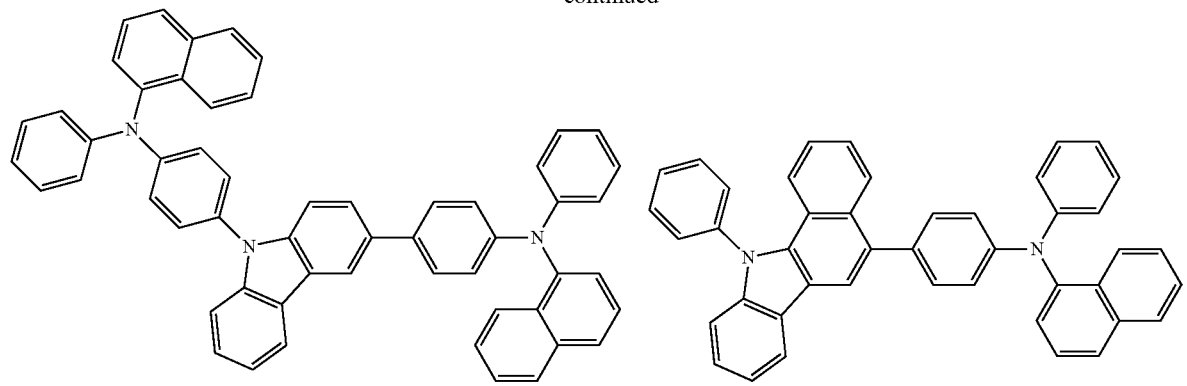
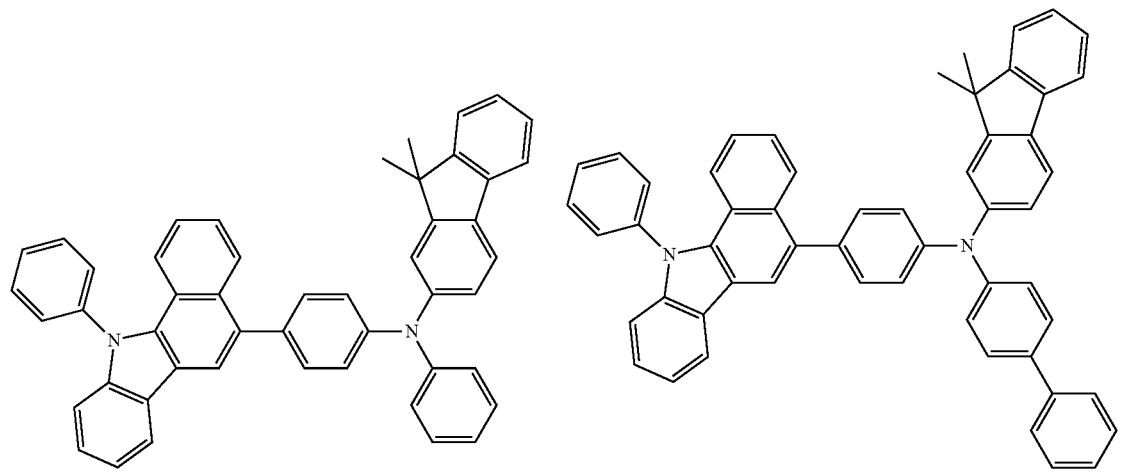
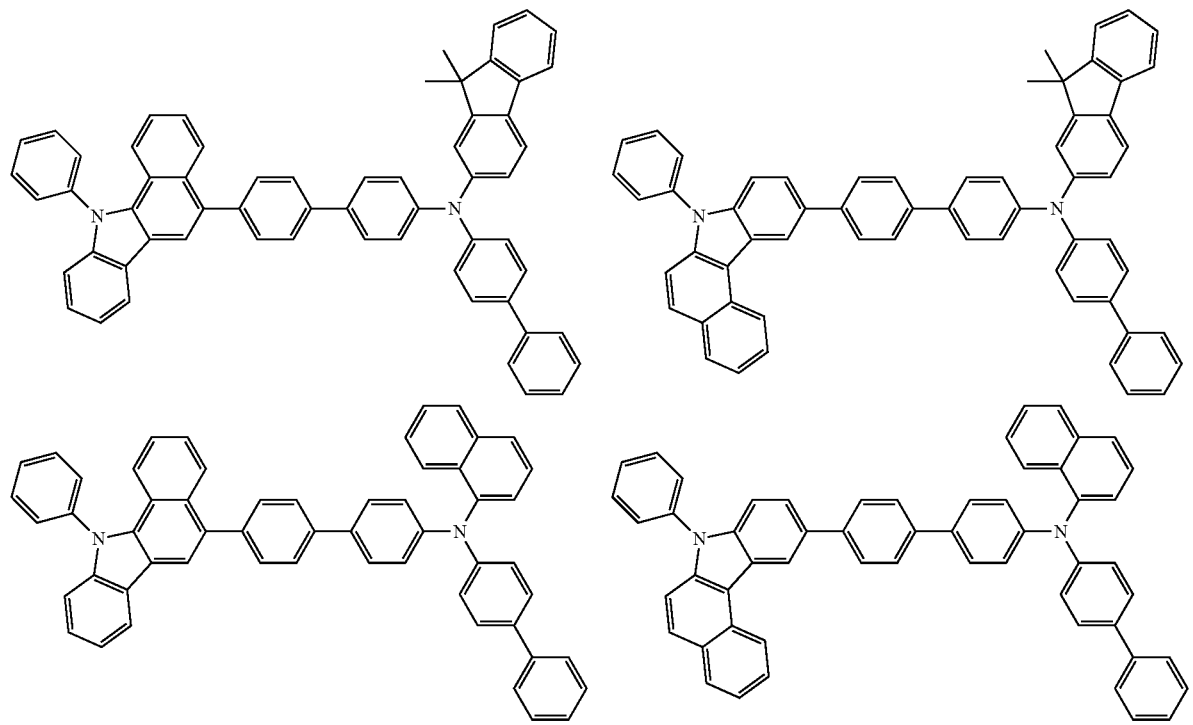

-continued

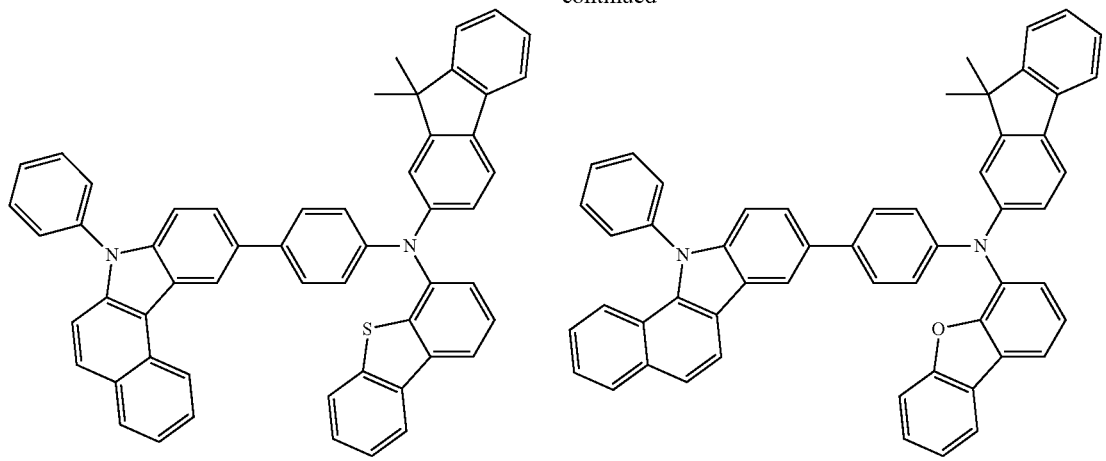

The organic light emitting diode according to the present invention may be manufactured by a manufacturing method and a material of a general organic light emitting diode, except that the one or more organic material layers are formed by using the aforementioned compounds.

The compounds represented by Formulas 1 and 2 may form the organic material layer by a vacuum deposition method and a solution coating method when the organic light emitting diode is manufactured. Herein, the solution coating method means spin coating, dip coating, inkjet printing, screen printing, a spray method, roll coating, and the like, but is not limited thereto.

The organic material layer of the organic light emitting diode of the present invention may have a single layer structure, or a multilayered structure in which two or more organic material layers are laminated. For example, the organic light emitting diode of the present invention may have a structure comprising a hole injection layer, a hole transport layer, a light emitting layer, an electron transport layer, an electron injection layer, and the like as an organic material layer. However, the structure of the organic light emitting diode is not limited thereto, but may comprise a smaller number of organic material layers.

For example, the structure of the organic light emitting diode of the present invention may have a structure illustrated in FIG. 1, but is not limited thereto.

FIG. 1 illustrates a structure of an organic light emitting diode, in which an anode 2, a hole injection layer 5, a hole transport layer 6, a light emitting layer 7, an electron transport layer 8, and a cathode 4 are sequentially laminated on a substrate 1. In the aforementioned structure, the compound represented by Formula 1 may be comprised in the hole transport layer 6.

For example, the organic light emitting diode according to the present invention may be manufactured by depositing metal, metal oxides having conductivity, or an alloy thereof on the substrate by using a PVD (physical vapor deposition) method such as sputtering or e-beam evaporation to form the anode, forming the organic material layer comprising the hole injection layer, the hole transport layer, the light emitting layer, and the electron transport layer thereon, and depositing the material that can be used as the cathode thereon. In addition to the aforementioned method, the organic light emitting diode may be manufactured by sequentially depositing a cathode material, an organic material layer, and an anode material on the substrate.

The organic material layer may have a multilayered structure comprising the hole injection layer, the hole transport layer, the light emitting layer, the electron transport layer, and the like, but is not limited thereto and may have a single layer structure. Further, the organic material layer may be manufactured to have the smaller number of layers by using various polymer materials and by not the deposition method but the solvent process, for example, a method such as spin coating, dip coating, doctor blading, screen printing, inkjet printing, or a heat transferring method.

It is preferable that the anode material be, in general, a material having a large work function so as to smoothly inject holes into the organic material layer. Specific examples of the anode material that can be used in the present invention comprise metal such as vanadium, chrome, copper, zinc, and gold, or an alloy thereof; metal oxides such as zinc oxides, indium oxides, indium tin oxides (ITO), and indium zinc oxides (IZO); a combination of metal and oxides such as ZnO:Al or $SnO_2$:Sb; conductive polymers such as poly(3-methyl compound), poly[3,4-(ethylene-1,2-dioxy) compound](PEDT), polypyrole, and polyaniline, and the like, but are not limited thereto.

It is preferable that the cathode material be, in general, a material having a small work function so as to easily inject electrons into the organic material layer. Specific examples of the cathode material comprise metal such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection material is a material that can well receive holes from the anode at a low voltage, and it is preferable that a HOMO (highest occupied molecular orbital) of the hole injection material be a value between a work function of the anode material and the HOMO of the organic material layer therearound. Specific examples of the hole injection material comprise metal porphyrine, oligothiophene, an arylamine-based organic material, a hexanitrilehexaazatriphenylene-based organic material, a quinacridone-based organic material, a perylene-based organic material, anthraquinone, polyaniline, a polycompound-based conductive polymer, and the like, but are not limited thereto.

The hole transport material is a material that can receive the holes from the anode or the hole injection layer and transport the holes to the light emitting layer, and is preferably a material having large mobility to the holes. Specific examples thereof comprise an arylamine-based organic material, a conductive polymer, a block copolymer in which a conjugate portion and a non-conjugate portion are present together, and the like, but are not limited thereto.

The light emitting material is a material that can receive the holes and the electrons from the hole transport layer and the electron transport layer, respectively, and bond the holes and the electrons to emit light in a visible ray region, and is preferably a material having good quantum efficiency to fluorescence or phosphorescence. Specific examples thereof comprise a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and the like, but are not limited thereto.

Particularly, in the organic light emitting diode according to the present invention, it is preferable that the light emitting layer comprise a blue fluorescent material or a green phosphorescent material.

The electron transport material is a material that can receive well the electrons from the cathode and transport the electrons to the light emitting layer, and is preferably a material having large mobility to the electrons. Specific examples thereof comprise a 8-hydroxyquinoline Al complex; a complex comprising $Alq_3$; an organic radical compound; a hydroxyflavone-metal complex, and the like, but are not limited thereto.

The organic light emitting diode according to the present invention may be a top emission type, a bottom emission type, or a both-sided emission type according to the used material. Further, the organic light emitting diode according to the present invention may have a positive structure in which a lower electrode is the anode and an upper electrode is the cathode, or a negative structure in which the lower electrode is the cathode and the upper electrode is the anode.

The compound according to the present invention may function even in an organic electronic diode such as an organic solar cell, an organic photoconductor, and an organic transistor based on the principle that is similar to the principle applied to the organic light emitting diode.

The organic light emitting diode according to the present invention comprises the exciton blocking layer comprising the compound represented by Formula 1 to confine an exciton to the light emitting layer to prevent light emitting leakage, and thus there is an effect of implementing an organic electroluminescence diode having excellent light emitting efficiency. Accordingly, it is possible to implement an organic light emitting diode having a simple and economical manufacturing process, a low voltage, high efficiency, and a long life span as compared to the related art.

MODE FOR INVENTION

Hereinafter, preferable Examples will be described in order to help understanding of the present invention. However, the following Examples are set forth to illustrate the present invention, but the scope of the present invention is not limited thereto.

EXAMPLE

Example 1

Manufacturing of the Organic Light Emitting Diode

The glass substrate (corning 7059 glass) on which the thin film of ITO (indium tin oxide) was applied to a thickness of 1,000 Å was immersed in distilled water having the detergent dissolved therein, and washed by the ultrasonic wave. In this case, the detergent as used herein was the product commercially available from Fischer Co. and the distilled water was one which had been twice filtered by using the filter commercially available from Millipore Co. ITO was washed for 30 mins, and washing with ultrasonic waves was then repeated twice for 10 mins by using distilled water. After the completion of washing with distilled water, washing with ultrasonic waves was performed by using solvents such as isopropyl alcohol, acetone, and methanol, and the resulting product was dried and transported to the plasma washing machine. Further, the substrate was dry-washed by using the oxygen plasma for 5 mins, and then transported to the vacuum deposition machine.

Hexanitrile hexaazatriphenylene (hereinafter, referred to as "HAT") that was the compound of the following Formula was deposited under the heat vacuum in a thickness of 100 Å on the prepared ITO transparent electrode to form the thin film. The interfacial characteristic between the substrate and the hole injection layer can be improved by the thin film. Subsequently, the compound of Formula HT-1 was deposited in a thickness of 800 Å on the thin film to form the hole transport layer, and the compound of the following Formula EB-4 was deposited in a thickness of 200 Å thereon to form the electron blocking layer. Subsequently, 10 wt % of the compound of Formula PD-1 was doped onto the compound of Formula PH-1 to form the light emitting layer in a thickness of 300 Å. The compound of Formula HB-1 was deposited in a thickness of 50 Å thereon to form the hole blocking layer, and subsequently, the electron transport layer material of Formula ET-1 was deposited in a thickness of 300 Å to form the electron transport layer. Lithium fluoride (LiF) in a thickness of 12 Å and aluminum in a thickness of 2,000 Å were sequentially deposited on the electron transport layer to form the cathode.

In the aforementioned process, the deposition rate of the organic material was maintained at 0.3 to 0.8 Å/sec. Further, the deposition rate of lithium fluoride of the cathode was maintained at 0.3 Å/sec, and the deposition rate of aluminum was maintained at 1.5 to 2.5 Å/sec. The degree of vacuum during the deposition was maintained at 1 to $3 \times 10^{-7}$.

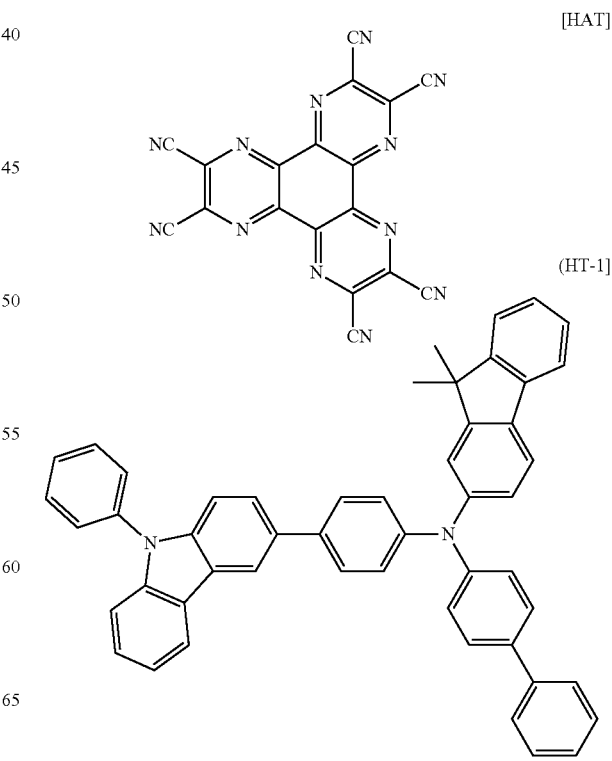

-continued (EB-4)

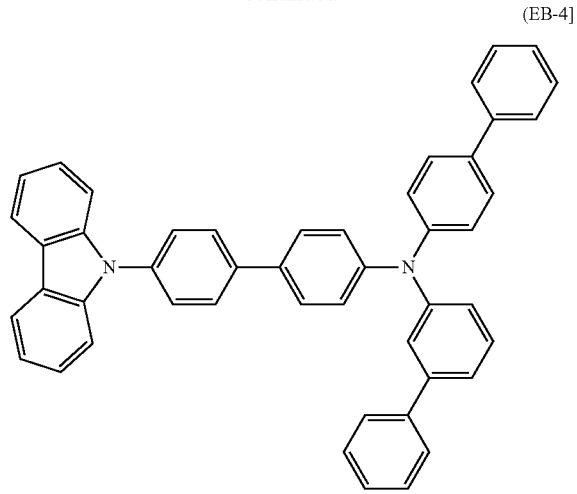

[PH-1]

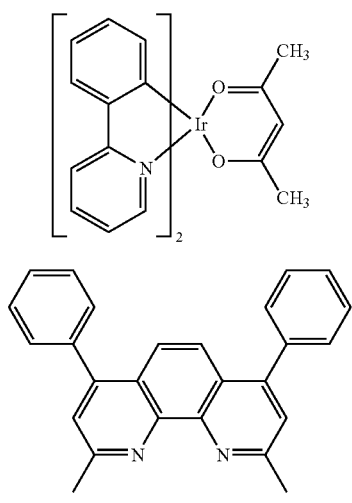

[PD-1]

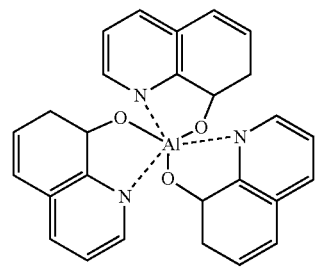

[HB-1]

[ET-1]

Example 2

Manufacturing of the Organic Light Emitting Diode

The same diode was manufactured, except that the compound of Formula EB-4 used as the electron blocking layer in Example 1 was substituted by the compound of the following Formula EB-5.

[EB-5]

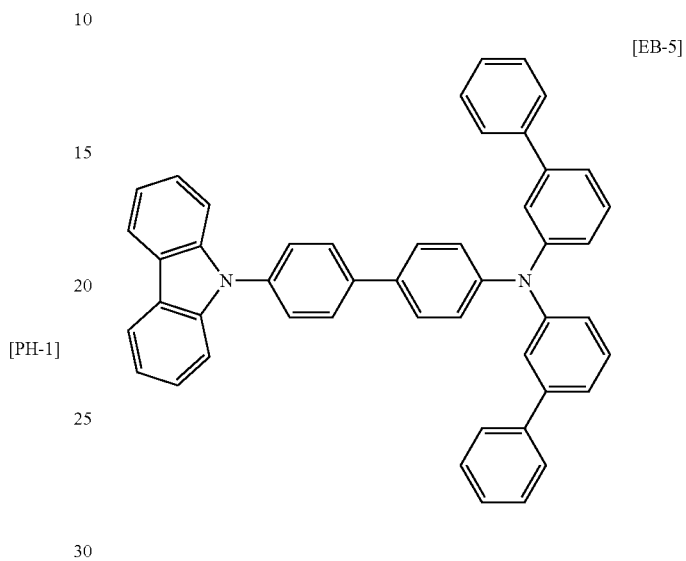

Example 3

Manufacturing of the Organic Light Emitting Diode

The same diode was manufactured, except that the compound of Formula EB-4 used as the electron blocking layer in Example 1 was substituted by the compound of the following Formula EB-6.

[EB-6]

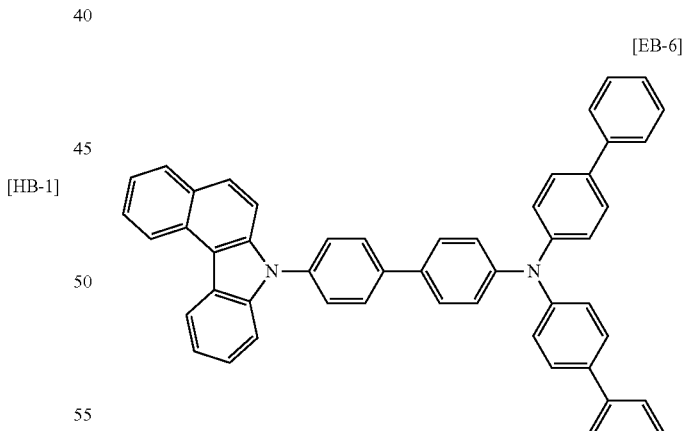

Example 4

Manufacturing of the Organic Light Emitting Diode

The same diode was manufactured, except that the compound of Formula EB-4 used as the electron blocking layer in Example 1 was substituted by the compound of the following Formula EB-7.

[EB-7]

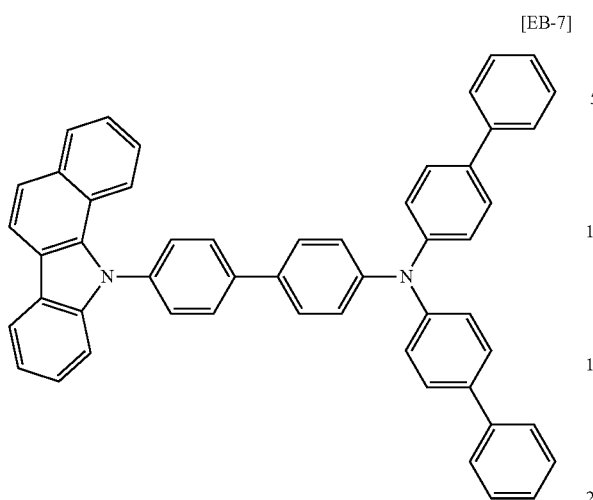

Example 5

Manufacturing of the Organic Light Emitting Diode

The same diode was manufactured, except that the compound of Formula HT-1 used as the hole transport layer in Example 1 was substituted by the compound of the following Formula HT-2.

[HT-2]

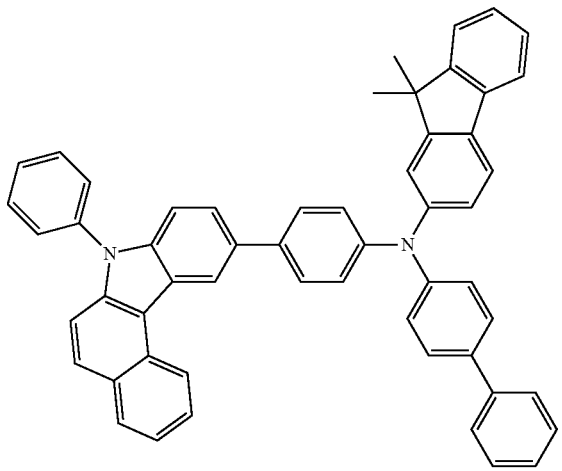

Example 6

Manufacturing of the Organic Light Emitting Diode

The same diode was manufactured, except that the compound of Formula HT-1 used as the hole transport layer in Example 2 was substituted by the compound of Formula HT-2.

Example 7

Manufacturing of the Organic Light Emitting Diode

The same diode was manufactured, except that the compound of Formula HT-1 used as the hole transport layer in Example 3 was substituted by the compound of Formula HT-2.

Example 8

Manufacturing of the Organic Light Emitting Diode

The same diode was manufactured, except that the compound of Formula HT-1 used as the hole transport layer in Example 4 was substituted by the compound of Formula HT-2.

Example 9

Manufacturing of the Organic Light Emitting Diode

The same diode was manufactured, except that the compound of Formula HT-1 used as the hole transport layer in Example 1 was substituted by the compound of the following Formula HT-3.

[HT-3]

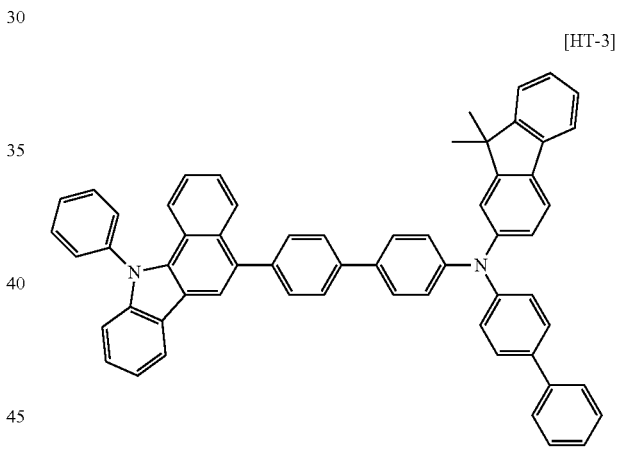

Example 10

Manufacturing of the Organic Light Emitting Diode

The same diode was manufactured, except that the compound of Formula HT-1 used as the hole transport layer in Example 2 was substituted by the compound of Formula HT-3.

Example 11

Manufacturing of the Organic Light Emitting Diode

The same diode was manufactured, except that the compound of Formula HT-1 used as the hole transport layer in Example 3 was substituted by the compound of Formula HT-3.

Example 12

Manufacturing of the Organic Light Emitting Diode

The same diode was manufactured, except that the compound of Formula HT-1 used as the hole transport layer in Example 4 was substituted by the compound of Formula HT-3.

The driving voltage and light emitting efficiency of the organic light emitting diode manufactured by the aforementioned method were measured at the current density of 10 mA/cm$^2$, and the time (LT90) at which brightness was 90% of initial brightness was measured at the current density of 20 mA/cm$^2$. The result is described in the following Table 1.

TABLE 1

| Example | Voltage (V) | Light emitting efficiency (cd/A) | CIE-x | CIE-y | LT90 (hr) at 20 mA/cm$^2$ |
|---|---|---|---|---|---|
| 1 | 5.3 | 69.9 | 0.443 | 0.546 | 333.9 |
| 2 | 6.2 | 66.3 | 0.443 | 0.545 | 345.9 |
| 3 | 5.8 | 62.6 | 0.446 | 0.543 | 396.0 |
| 4 | 4.0 | 63.0 | 0.438 | 0.550 | 389.0 |
| 5 | 4.4 | 61.5 | 0.439 | 0.549 | 423.1 |
| 6 | 4.6 | 69.7 | 0.440 | 0.548 | 421.1 |
| 7 | 4.5 | 71.8 | 0.433 | 0.554 | 414.7 |
| 8 | 4.2 | 73.0 | 0.428 | 0.559 | 400.0 |
| 9 | 4.1 | 70.7 | 0.423 | 0.562 | 467.1 |
| 10 | 4.8 | 73.1 | 0.442 | 0.546 | 450.8 |
| 11 | 4.7 | 74.3 | 0.435 | 0.552 | 431.0 |
| 12 | 4.5 | 74.1 | 0.429 | 0.557 | 400.0 |

Comparative Example 1

Manufacturing of the Organic Light Emitting Diode

The same diode was manufactured, except that the compound of Formula EB-4 used as the electron blocking layer in Example 1 was substituted by the compound of the following Formula EB-1.

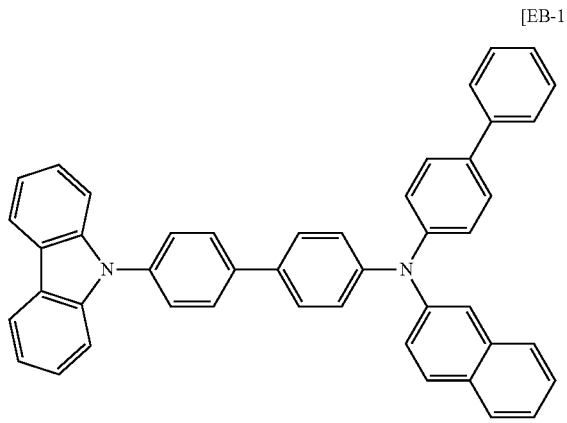

[EB-1]

Comparative Example 2

Manufacturing of the Organic Light Emitting Diode

The same diode was manufactured, except that the compound of Formula EB-4 used as the electron blocking layer in Example 1 was substituted by the compound of the following Formula EB-2.

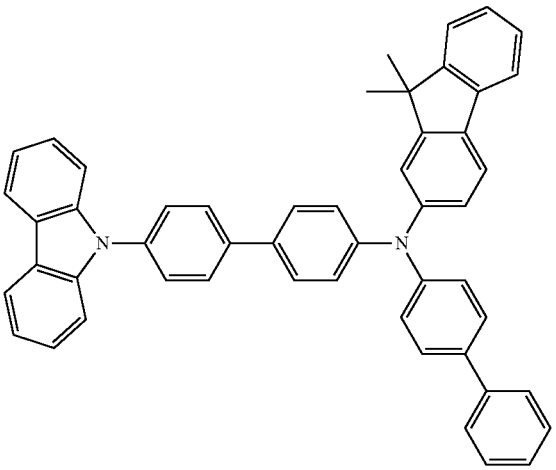

[EB-2]

Comparative Example 3

Manufacturing of the Organic Light Emitting Diode

The same diode was manufactured, except that the compound of Formula EB-4 used as the electron blocking layer in Example 1 was substituted by the compound of the following Formula EB-3.

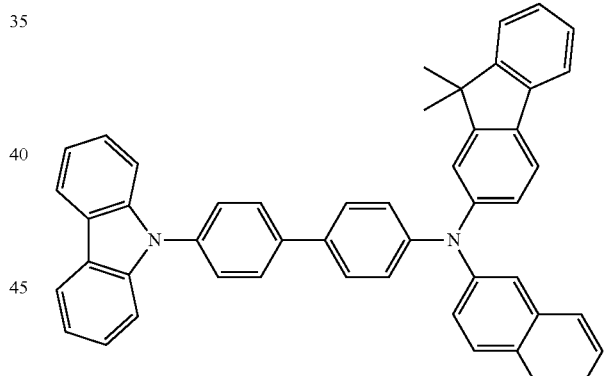

[EB-3]

Comparative Example 4

Manufacturing of the Organic Light Emitting Diode

The same diode was manufactured, except that the compound of Formula EB-4 used as the electron blocking layer in Example 5 was substituted by the compound of Formula EB-1.

Comparative Example 5

Manufacturing of the Organic Light Emitting Diode

The same diode was manufactured, except that the compound of Formula EB-4 used as the electron blocking layer in Example 5 was substituted by the compound of Formula EB-2.

Comparative Example 6

Manufacturing of the Organic Light Emitting Diode

The same diode was manufactured, except that the compound of Formula EB-4 used as the electron blocking layer in Example 5 was substituted by the compound of Formula EB-3.

Comparative Example 7

Manufacturing of the Organic Light Emitting Diode

The same diode was manufactured, except that the compound of Formula EB-4 used as the electron blocking layer in Example 9 was substituted by the compound of Formula EB-1.

Comparative Example 8

Manufacturing of the Organic Light Emitting Diode

The same diode was manufactured, except that the compound of Formula EB-4 used as the electron blocking layer in Example 9 was substituted by the compound of Formula EB-2.

Comparative Example 9

Manufacturing of the Organic Light Emitting Diode

The same diode was manufactured, except that the compound of Formula EB-4 used as the electron blocking layer in Example 9 was substituted by the compound of Formula EB-3.

Comparative Example 10

Manufacturing of the Organic Light Emitting Diode

The same diode was manufactured, except that the compound of Formula HT-1 used as the hole transport layer in Example 1 was substituted by the compound of the following Formula HT-4 and the compound of Formula EB-4 used as the electron blocking layer was substituted by the compound of Formula EB-1.

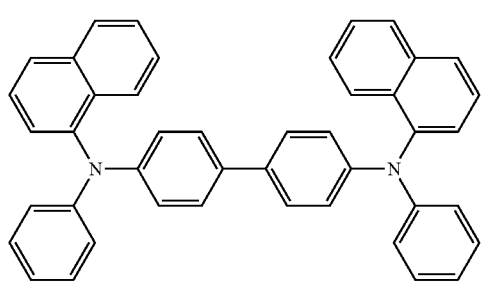

[HT-4]

Comparative Example 11

Manufacturing of the Organic Light Emitting Diode

The same diode was manufactured, except that the compound of Formula HT-1 used as the hole transport layer in Example 1 was substituted by the compound of Formula HT-4 and the compound of Formula EB-4 used as the electron blocking layer was substituted by the compound of Formula EB-2.

Comparative Example 12

Manufacturing of the Organic Light Emitting Diode

The same diode was manufactured, except that the compound of Formula HT-1 used as the hole transport layer in Example 1 was substituted by the compound of Formula HT-4 and the compound of Formula EB-4 used as the electron blocking layer was substituted by the compound of Formula EB-3.

Comparative Example 13

Manufacturing of the Organic Light Emitting Diode

The same diode was manufactured, except that the compound of Formula HT-1 used as the hole transport layer in Example 1 was substituted by the compound of the following Formula HT-5 and the compound of Formula EB-4 used as the electron blocking layer was substituted by the compound of Formula EB-1.

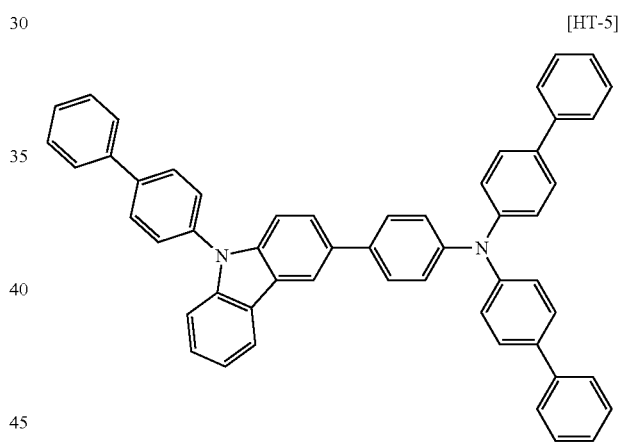

[HT-5]

Comparative Example 14

Manufacturing of the Organic Light Emitting Diode

The same diode was manufactured, except that the compound of Formula HT-1 used as the hole transport layer in Example 1 was substituted by the compound of Formula HT-5 and the compound of Formula EB-4 used as the electron blocking layer was substituted by the compound of Formula EB-2.

Comparative Example 15

Manufacturing of the Organic Light Emitting Diode

The same diode was manufactured, except that the compound of Formula HT-1 used as the hole transport layer in Example 1 was substituted by the compound of Formula HT-5 and the compound of Formula EB-4 used as the electron blocking layer was substituted by the compound of Formula EB-3.

Comparative Example 16

Manufacturing of the Organic Light Emitting Diode

The same diode was manufactured, except that the compound of Formula HT-1 used as the hole transport layer in Example 1 was substituted by the compound of Formula HT-4.

Comparative Example 17

Manufacturing of the Organic Light Emitting Diode

The same diode was manufactured, except that the compound of Formula HT-1 used as the hole transport layer in Example 2 was substituted by the compound of Formula HT-4.

Comparative Example 18

Manufacturing of the Organic Light Emitting Diode

The same diode was manufactured, except that the compound of Formula HT-1 used as the hole transport layer in Example 3 was substituted by the compound of Formula HT-4.

Comparative Example 19

Manufacturing of the Organic Light Emitting Diode

The same diode was manufactured, except that the compound of Formula HT-1 used as the hole transport layer in Example 4 was substituted by the compound of Formula HT-4.

Comparative Example 20

Manufacturing of the Organic Light Emitting Diode

The same diode was manufactured, except that the compound of Formula HT-1 used as the hole transport layer in Example 1 was substituted by the compound of Formula HT-5.

Comparative Example 21

Manufacturing of the Organic Light Emitting Diode

The same diode was manufactured, except that the compound of Formula HT-1 used as the hole transport layer in Example 2 was substituted by the compound of Formula HT-5.

Comparative Example 22

Manufacturing of the Organic Light Emitting Diode

The same diode was manufactured, except that the compound of Formula HT-1 used as the hole transport layer in Example 3 was substituted by the compound of Formula HT-5.

Comparative Example 23

Manufacturing of the Organic Light Emitting Diode

The same diode was manufactured, except that the compound of Formula HT-1 used as the hole transport layer in Example 4 was substituted by the compound of Formula HT-5.

The driving voltage and light emitting efficiency of the organic light emitting diode manufactured by the aforementioned method were measured at the current density of 10 mA/cm$^2$, and the time (LT90) at which brightness was 90% of initial brightness was measured at the current density of 20 mA/cm$^2$. The result is described in the following Table 2.

TABLE 2

| Comparative Example | Voltage (V) | Light emitting efficiency (cd/A) | CIE-x | CIE-y | LT90 (hr) at 20 mA/cm$^2$ |
|---|---|---|---|---|---|
| 1 | 6.5 | 59.9 | 0.407 | 0.573 | 229.8 |
| 2 | 9.5 | 61.8 | 0.437 | 0.551 | 229.1 |
| 3 | 7.6 | 61.2 | 0.436 | 0.552 | 229.7 |
| 4 | 9.4 | 61.4 | 0.428 | 0.558 | 231.3 |
| 5 | 5.8 | 60.5 | 0.432 | 0.555 | 232.4 |
| 6 | 8.5 | 59.3 | 0.426 | 0.560 | 232.3 |
| 7 | 8.4 | 60.2 | 0.427 | 0.559 | 233.0 |
| 8 | 7.3 | 59.9 | 0.432 | 0.554 | 235.6 |
| 9 | 5.1 | 59.2 | 0.431 | 0.555 | 237.1 |
| 10 | 5.0 | 54.5 | 0.432 | 0.542 | 192.9 |
| 11 | 6.1 | 54.1 | 0.449 | 0.540 | 195.5 |
| 12 | 7.2 | 53.6 | 0.446 | 0.542 | 196.1 |
| 13 | 4.7 | 53.9 | 0.442 | 0.542 | 197.7 |
| 14 | 6.0 | 51.6 | 0.458 | 0.529 | 198.7 |
| 15 | 5.5 | 53.6 | 0.443 | 0.545 | 197.7 |
| 16 | 5.9 | 54.1 | 0.445 | 0.537 | 202.6 |
| 17 | 6.2 | 50.3 | 0.422 | 0.562 | 203.5 |
| 18 | 3.7 | 51.0 | 0.439 | 0.544 | 200.9 |
| 19 | 4.2 | 54.2 | 0.444 | 0.545 | 201.9 |
| 20 | 8.3 | 59.2 | 0.425 | 0.560 | 248.5 |
| 21 | 7.7 | 59.2 | 0.434 | 0.553 | 240.9 |
| 22 | 8.4 | 59.4 | 0.429 | 0.557 | 243.9 |
| 23 | 7.1 | 58.7 | 0.420 | 0.564 | 250.6 |

It can be confirmed that the organic light emitting diodes of Examples 1 to 12 have high light emitting efficiency and the improved diode life span, and through this, it can be confirmed that light emitting and life span characteristics of the diode can be improved through a combination of the hole transport layer material having the structure in which the fluorene group or the naphthalene group is directly connected to amine and the electron blocking layer material having the structure in which the fluorene group or the naphthalene group is not directly connected to amine.

The invention claimed is:
1. An organic light emitting diode comprising an anode, a cathode, and one or more organic material layers interposed between the anode and the cathode,
wherein the one or more organic material layers comprise a light emitting layer,
an organic material layer comprising a compound represented by the following Formula 1 and an organic material layer comprising a compound represented by the following Formula 2 are comprised between the anode and the light emitting layer,
the organic material layer comprising a compound represented by the Formula 2 is a hole transport layer, and
the organic material layer comprising a compound represented by the Formula 1 is an electron blocking layer:

[Formula 1]

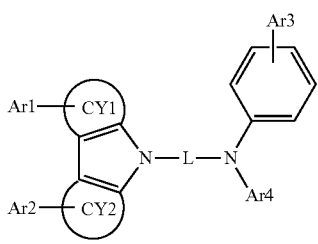

wherein,

CY1 and CY2 are the same as or different from each other, and each independently represent a benzene cycle or a naphthalene cycle, Ar1 and Ar2 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar3 and Ar4 are the same as or different from each other, and each independently selected from the group consisting of a substituted or unsubstituted phenyl group or a substituted or unsubstituted biphenyl group, L is a substituted or unsubstituted arylene group having 6 to 30 carbon atoms,

[Formula 2]

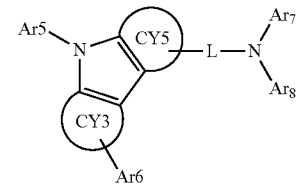

wherein,

CY3 to CY4 are the same as or different from each other, and each independently represent a benzene cycle or a naphthalene cycle, Ar5 to Ar8 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, at least one of Ar7 and Ar8 is a substituted or unsubstituted fluorene group or a substituted or unsubstituted naphthyl group, and L is a substituted or unsubstituted arylene group having 6 to 30 carbon atoms.

2. The organic light emitting diode of claim 1, wherein both CY1 and CY2 of Formula 1 are a benzene cycle, Ar3 is hydrogen or a phenyl group, and Ar4 is a phenyl group or a biphenyl group.

3. The organic light emitting diode of claim 1, wherein both CY1 and CY2 of Formula 1 are a benzene cycle, and L is a biphenylene group.

4. The organic light emitting diode of claim 1, wherein the compound represented by Formula 1 is represented by any one of the following Formulas 3 to 5:

[Formula 3]

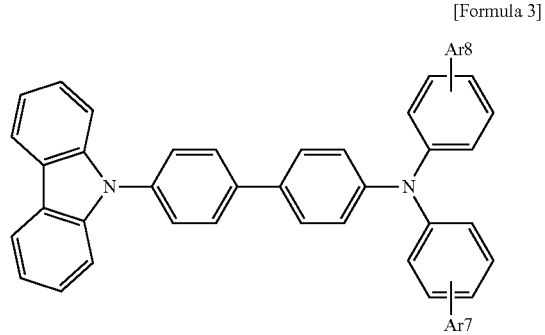

[Formula 4]

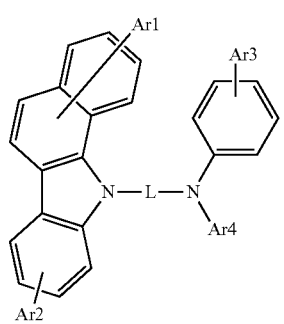

[Formula 5]

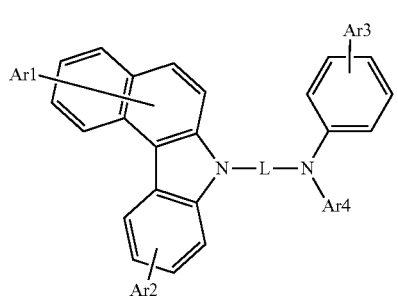

wherein,

Ar1 to Ar4, and L are the same as definitions of Formula 1, and at least one of Ar7 and Ar8 is a phenyl group, and the other is hydrogen, a substituted or unsubstituted alkyl group having 1 to 10 carbon atoms, or a phenyl group.

5. The organic light emitting diode of claim 1, wherein the compound represented by Formula 1 is selected from the group consisting of the following Structural Formulas:

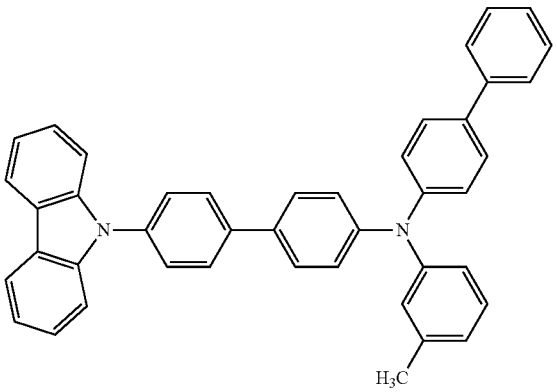

37
-continued
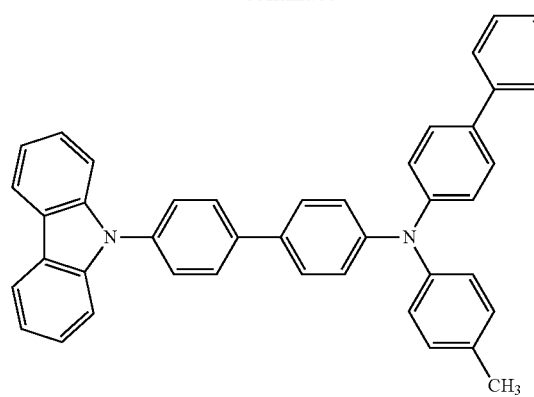
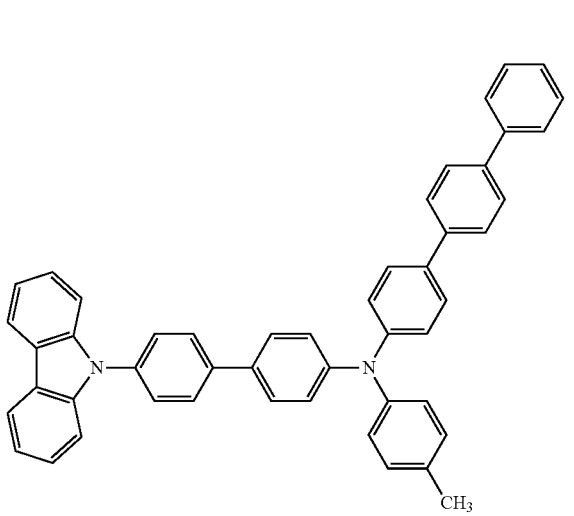
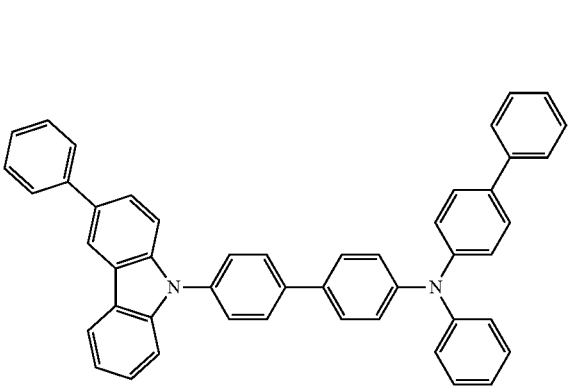
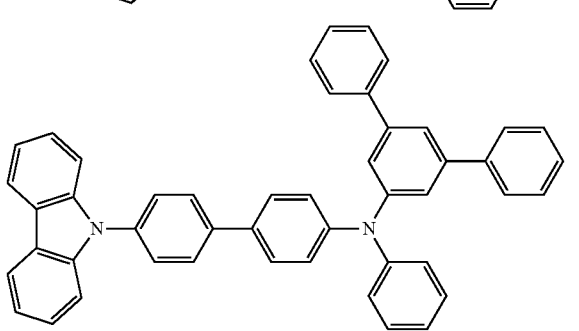
38
-continued
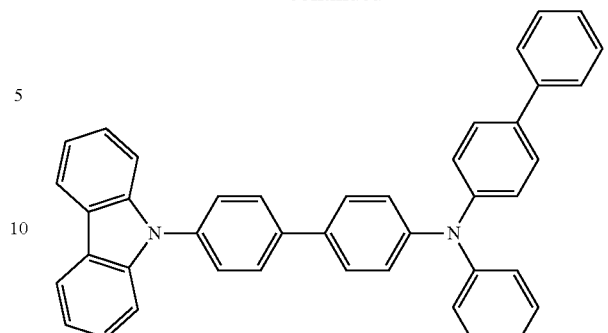
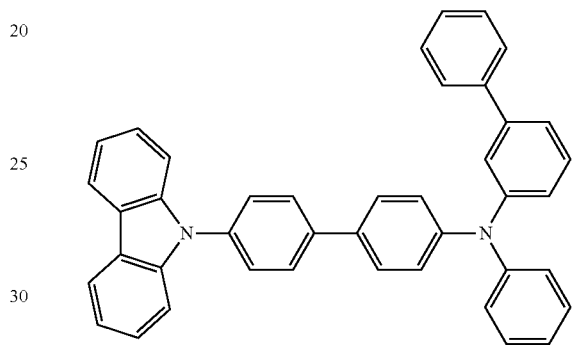
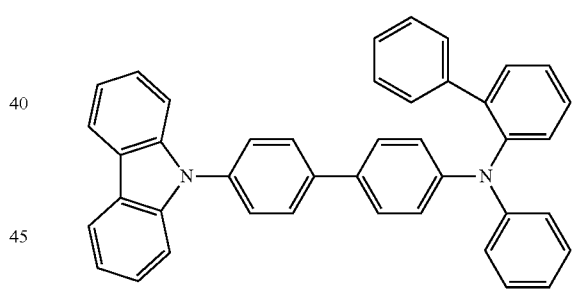
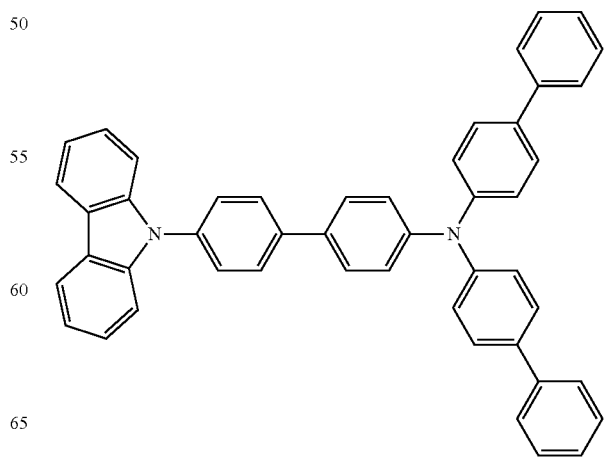

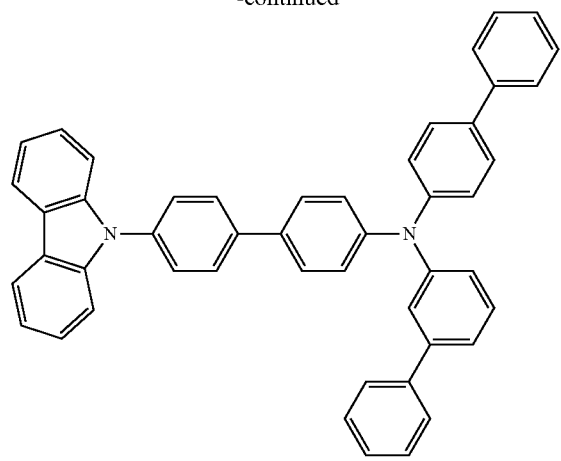
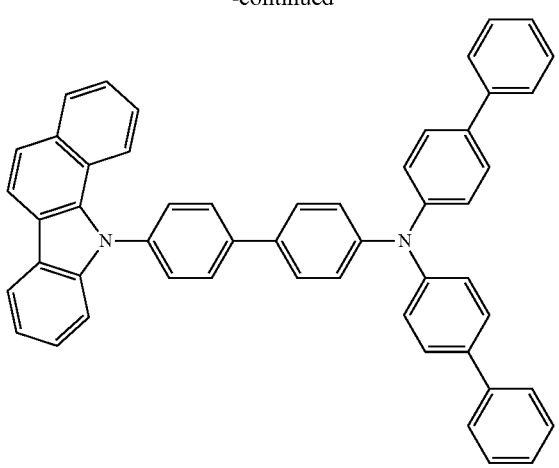
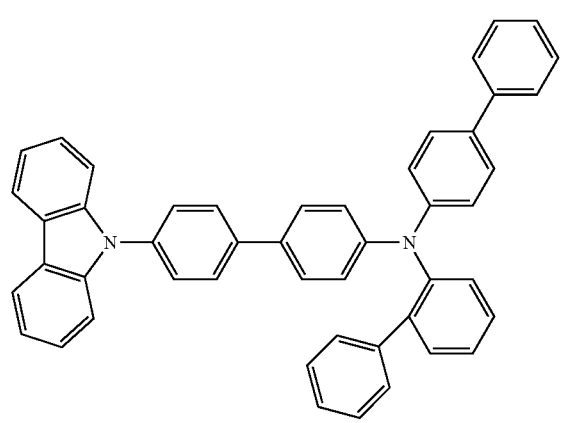
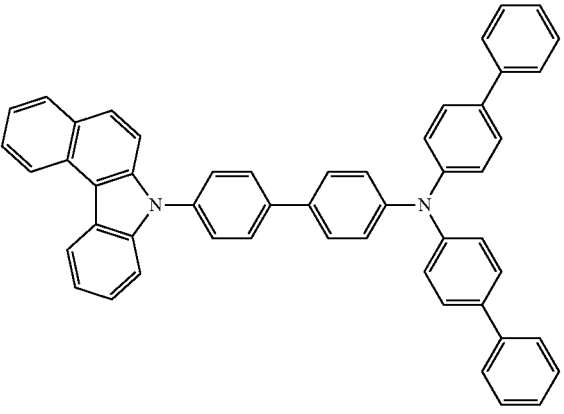
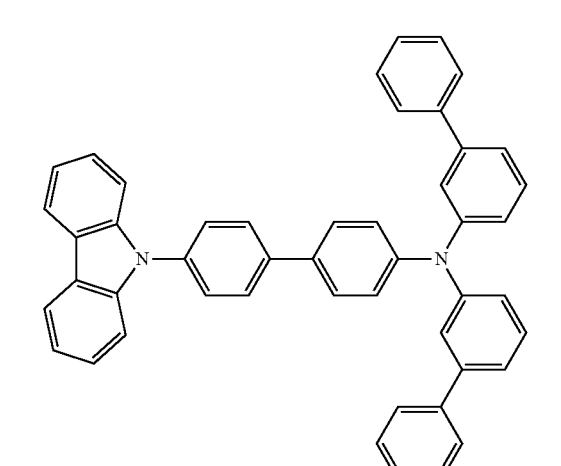
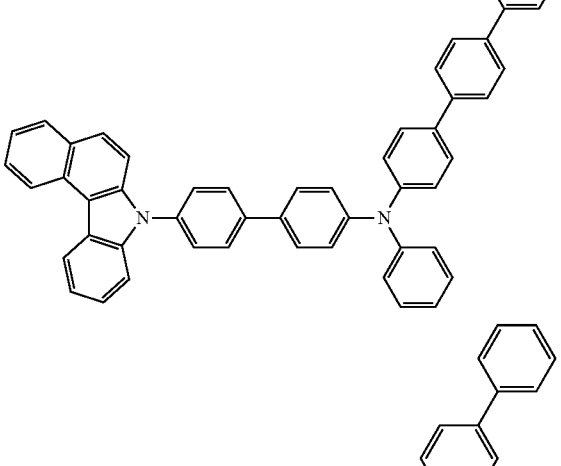
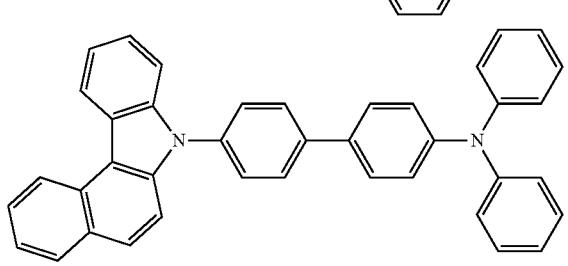
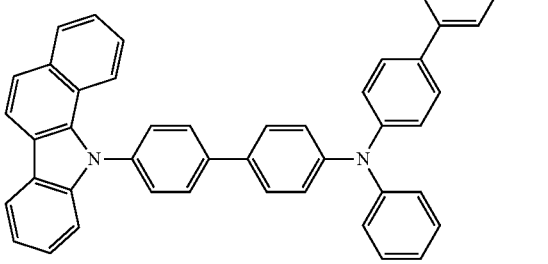

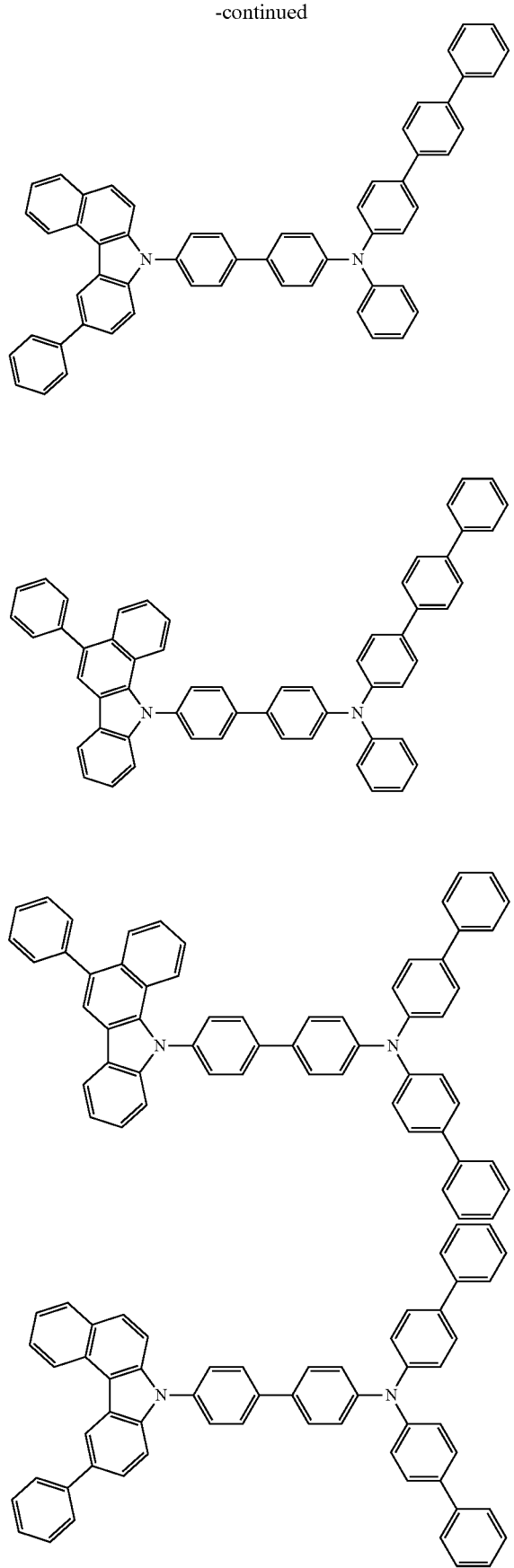
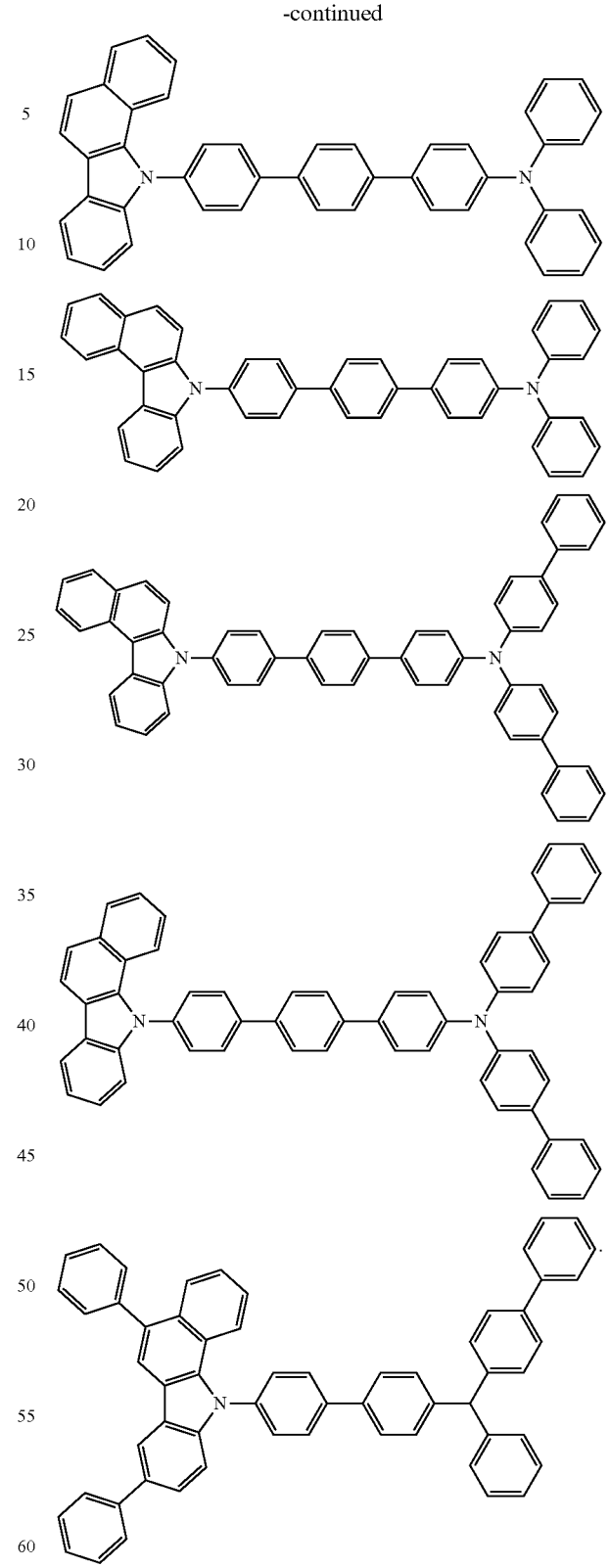
6. The organic light emitting diode of claim 1, wherein the compound represented by Formula 2 is selected from the group consisting of the following Structural Formulas:

43 44
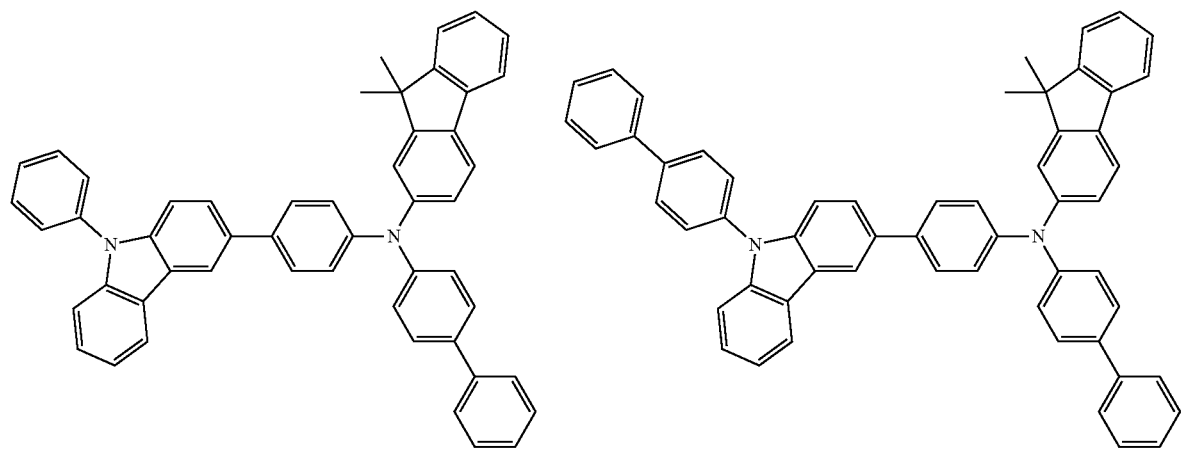
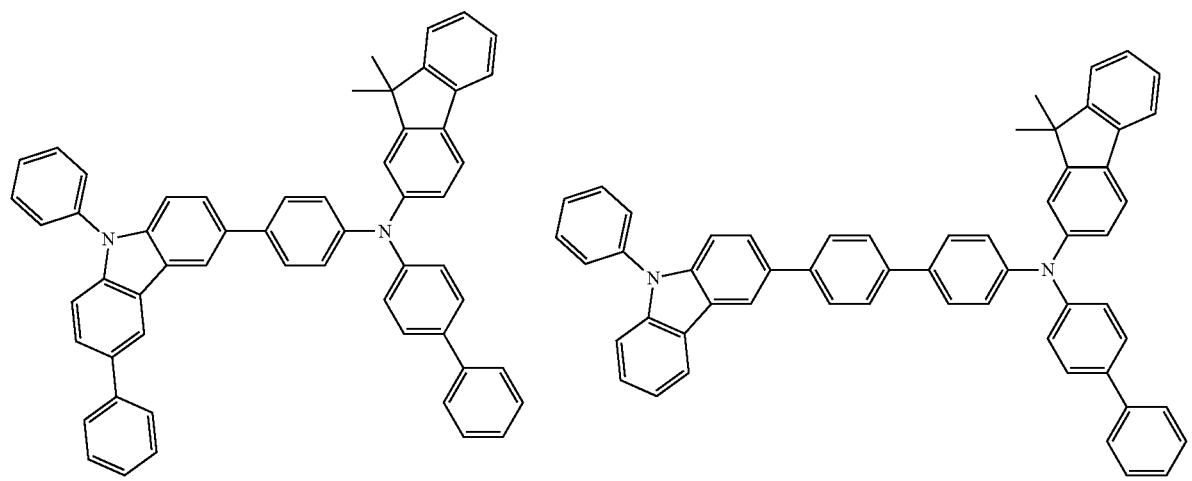
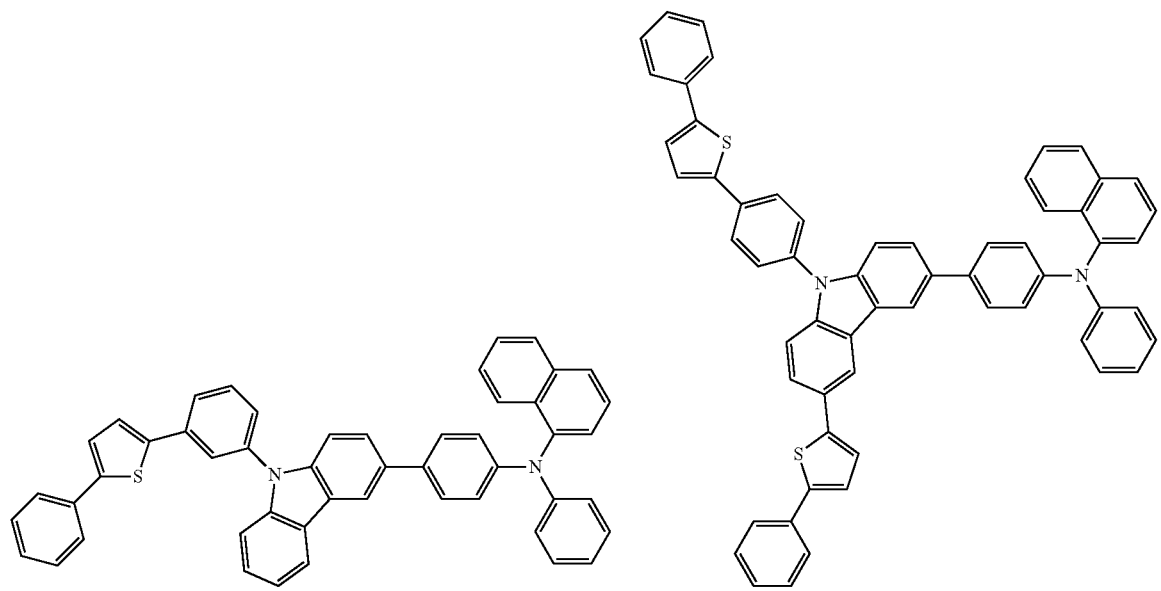

-continued
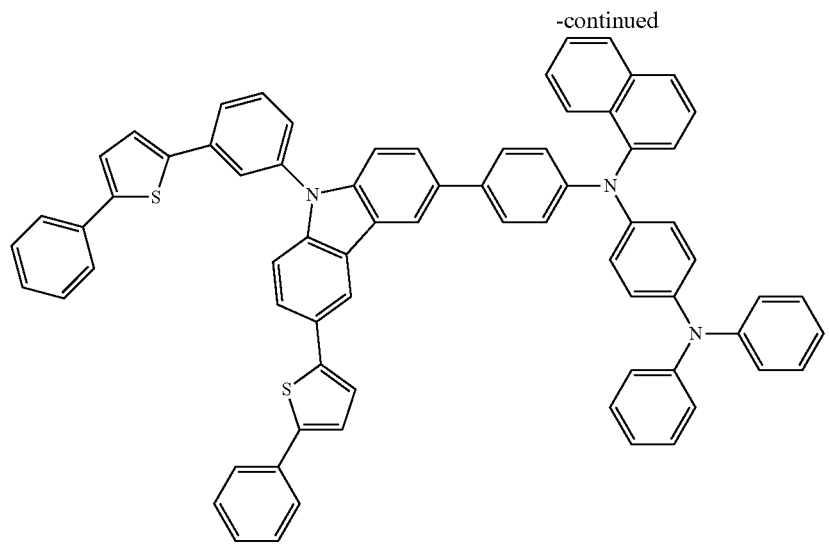
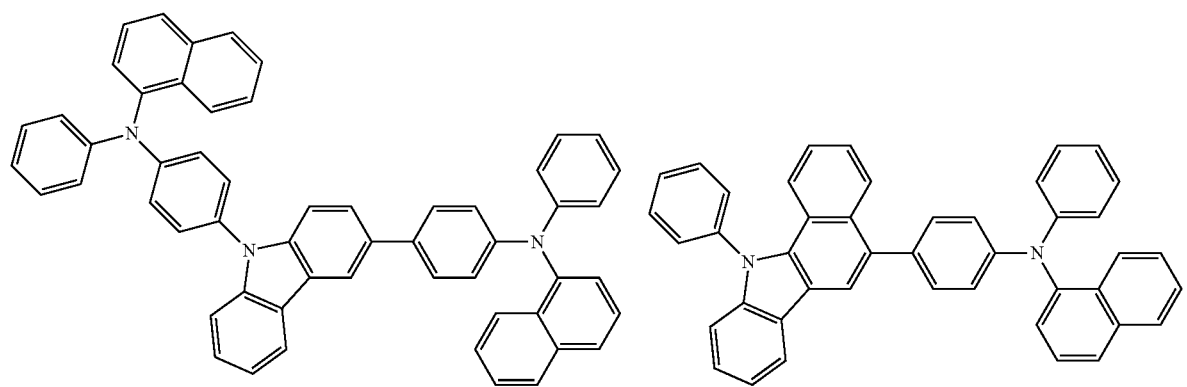
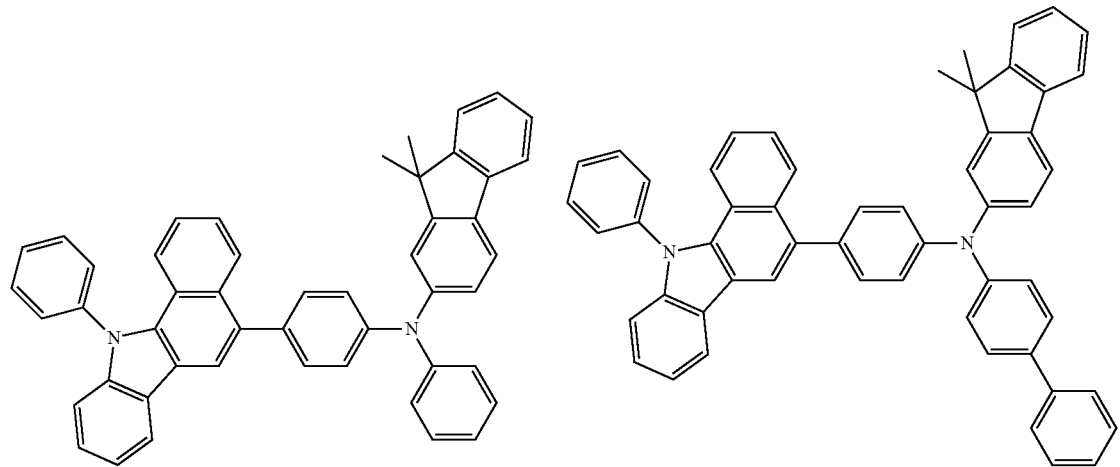

-continued
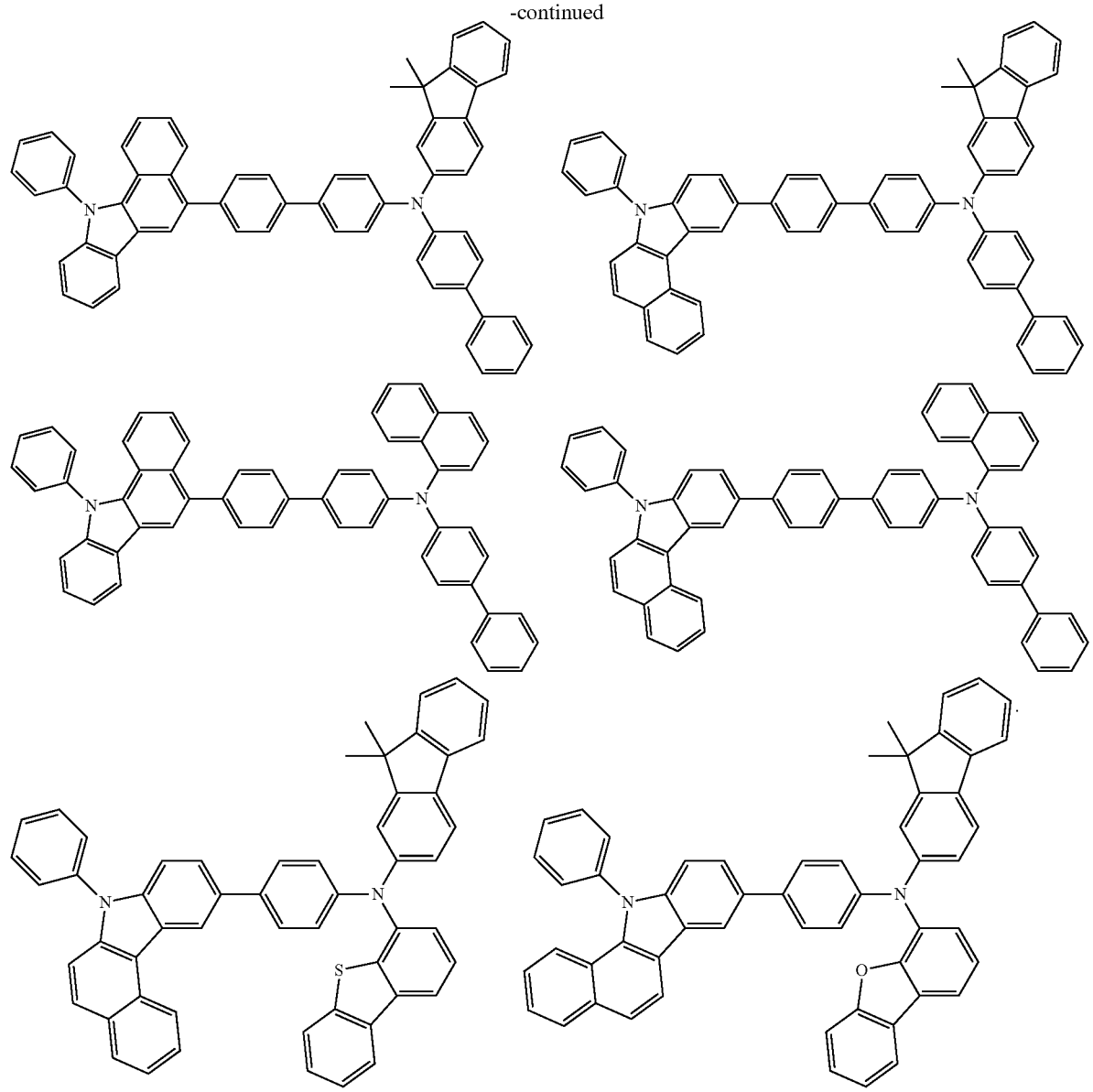
* * * * *